(12) United States Patent
Takagi et al.

(10) Patent No.: US 6,377,138 B1
(45) Date of Patent: *Apr. 23, 2002

(54) SURFACE ACOUSTIC WAVE DEVICE WITH A LAYERED CONDUCTIVE FILM AND METHOD OF PRODUCING THE SAME

(75) Inventors: Toshiyuki Takagi, Yokohama; Hitoshi Chiyoma, Asahikawa; Naoki Akahori, Ichikawa; Yasuo Ebata, Yokohama; Minoru Kawase, Fuzisawa; Masayoshi Koshino, Tokyo; Kaoru Sakinada, Asahikawa, all of (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/269,181
(22) PCT Filed: Jul. 28, 1998
(86) PCT No.: PCT/JP98/03360
  § 371 Date: Jun. 4, 1999
  § 102(e) Date: Jun. 4, 1999
(87) PCT Pub. No.: WO99/05788
  PCT Pub. Date: Feb. 4, 1999

(30) Foreign Application Priority Data

Jul. 28, 1997 (JP) ............................................. 9-201919
Aug. 15, 1997 (JP) ............................................. 9-220346
Sep. 19, 1997 (JP) ............................................. 9-254812
Jul. 9, 1998 (JP) ........................................... 10-194301

(51) Int. Cl.$^7$ ........................... H03H 9/64; H03H 9/145; H03H 9/25
(52) U.S. Cl. ................... 333/193; 333/195; 310/313 B; 310/364
(58) Field of Search .................................. 333/193–196; 310/313 R, 313 B, 313 C, 313 D, 364

(56) References Cited

U.S. PATENT DOCUMENTS 3,959,747 A * 5/1976 Turski et al. ........... 310/364 X (List continued on next page.)

FOREIGN PATENT DOCUMENTS

FR 2711863 * 5/1995

(List continued on next page.)

OTHER PUBLICATIONS

Atsushi Kamijo and Tsutmu Mitsuzuka, "A highly oriented Al[111] texture developed on ultrathin metal underlayers", J. Appl. Phys 77, 1995 American Institute of Physics, Apr. 15, 1995, pp. 3799–3804.

Primary Examiner—Robert Pascal
Assistant Examiner—Barbara Summons
(74) Attorney, Agent, or Firm—Oblon, Spivak, McClelland, Maier & Neustadt, P.C.

(57) ABSTRACT

A surface acoustic wave filter element and a method of producing the same. The element is constructed in a manner such that a conductive film, which constitutes a plurality of electrode fingers, a bus bar connecting the electrode fingers in common, an electrode pad connected to the bus bar, etc., is formed on a piezoelectric substrate. When using the surface acoustic wave filter element with this arrangement in a high-frequency band, the thickness of the conductive film and the line width of electrodes are reduced, so that the mechanical strength is a critical problem. According to the present invention, therefore, the conductive film has a two-layer structure, including a layer containing tantalum and aluminum and a metallic layer of aluminum or an alloy consisting mainly of aluminum formed thereon, for example. The composition ratio between tantalum and aluminum is set so that the tantalum content ranges from 39% to 75% (atomic percentage). Thus, the orientation the layer of aluminum or the alloy consisting mainly of aluminum, formed on the layer containing tantalum and aluminum, is improved to increase the strength of the conductive film.

12 Claims, 23 Drawing Sheets

U.S. PATENT DOCUMENTS

| | | | |
|---|---|---|---|
| 4,775,814 A | * 10/1988 | Yuhara et al. | 310/313 R |
| 5,773,917 A | * 6/1998 | Satoh et al. | 310/364 |
| 5,844,347 A | * 12/1998 | Takayama et al. | 310/364 X |
| 5,909,156 A | * 6/1999 | Nishihara et al. | 310/364 X |

FOREIGN PATENT DOCUMENTS

| | | | |
|---|---|---|---|
| JP | 59-55615 A | | 3/1984 |
| JP | 62-168410 | * | 7/1987 |
| JP | 63-263815 A | | 10/1988 |
| JP | 4-44408 A | | 2/1992 |
| JP | 4-288718 A | | 10/1992 |
| JP | 5-206776 A | | 8/1993 |
| JP | 5-226337 A | | 9/1993 |
| JP | 6-6173 A | | 1/1994 |
| JP | 6-326103 A | | 11/1994 |
| JP | 6-350377 | * | 12/1994 |
| JP | 6-350379 | * | 12/1994 |
| JP | 8-107330 A | | 4/1996 |
| JP | 8-139564 A | | 5/1996 |
| JP | 8-148966 A | | 6/1996 |
| JP | 8-250966 A | | 9/1996 |
| JP | 9-98051 | * | 4/1997 |
| JP | 11-163661 | * | 6/1999 |

* cited by examiner

| COMPOSITION RATIO BETWEEN Ta AND Al (ATOMIC POWER) | FULL WIDTH AT HALF MAXIMUM OF Al (DEGREE) |
|---|---|
| Ta:Al=75:25 | 0.80° |
| Ta:Al=64:36 | 0.74° |
| Ta:Al=48:52 | 0.77° |
| Ta:Al=45:55 | 0.81° |
| Ta:Al=39:61 | 0.88° |
| Ta:Al=32:68 | 1.40° |
| Ta:Al=16:84 | 1.90° |

*FIG. 4*

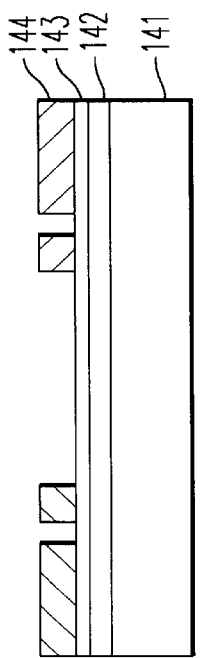
FIG. 14A
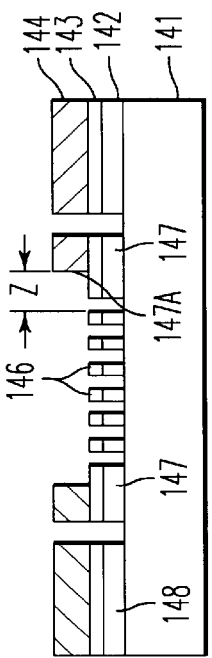
FIG. 14D
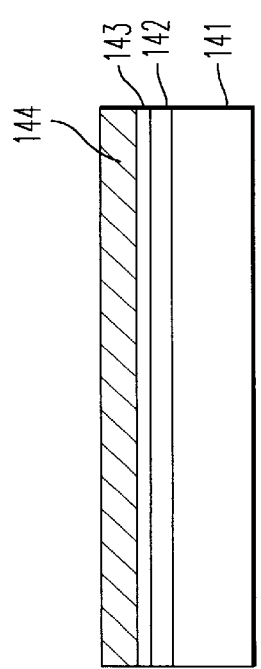
FIG. 14B
FIG. 14C
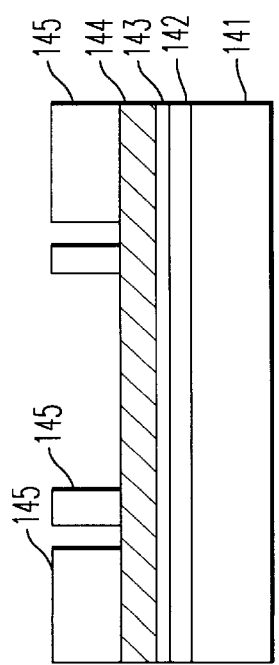
FIG. 14E
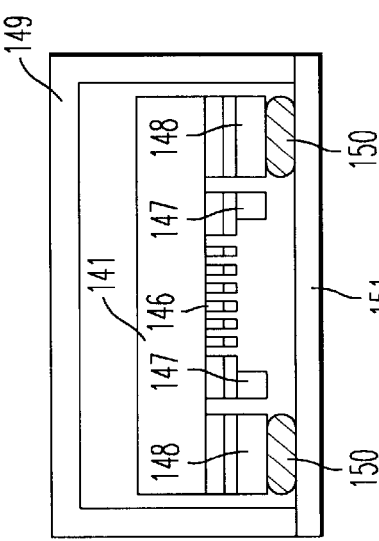
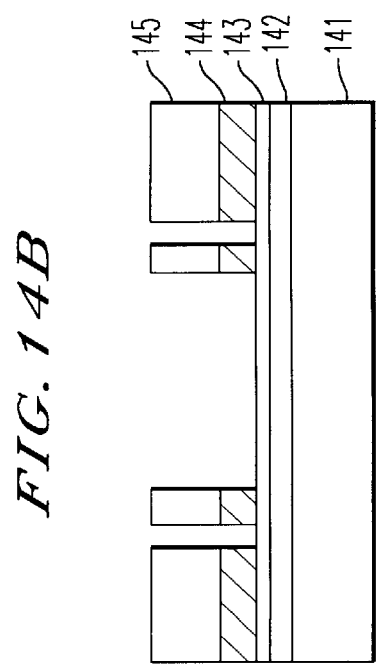
FIG. 14F

SURFACE ACOUSTIC WAVE DEVICE WITH A LAYERED CONDUCTIVE FILM AND METHOD OF PRODUCING THE SAME

BACKGROUND OF THE INVENTION

1. Field of the Invention

The present invention relates to a surface acoustic wave filter and a method for manufacturing the same, and more particularly, to a surface acoustic wave filter adapted for a high-frequency band and a method for manufacturing the same.

2. Discussion of the Background

A conventional surface acoustic wave filter will be described with reference to FIG. 34. Numeral 341 denotes a piezoelectric substrate, and an input transducer 342 and an output transducer 343 are arranged on the piezoelectric substrate 341. The input transducer 342 and the output transducer 343 are formed of a plurality of combed-type electrode fingers 344 or the like each. The electrode fingers 344 are connected in common by means of bus bars 345, which are connected to electrode pads 346, individually. Grating reflectors 347 are provided outside the input transducer 342 and the output transducer 343.

The electrode fingers 344, bus bars 345, electrode pads 346, and grating reflectors 347 are formed individually as conductive films with predetermined patterns. In many cases, aluminum is used for the conductive films, since it has low resistance and facilitates pattern formation.

In the arrangement described above, electric energy from the input transducer 342 is applied to the piezoelectric substrate 341 and converted into mechanical resonating energy. In contrast with this, mechanical resonating energy from the piezoelectric substrate 341 is converted into electric energy and fetched as a signal from the output transducer 343.

Frequency bands used in the mobile communication field are becoming higher and higher. In surface acoustic wave filters used in mobile communication equipment, therefore, the film thickness of electrodes formed of conductive films and line width are reduced. If the film thickness and line width are reduced, a problem called electro-migration or stress migration arises.

Electro-migration is a failure such that the crystal grains of aluminum or the like, which forms the electrodes, are caused to migrate by current that flows through the electrodes, thus resulting in electrode disconnection. Stress migration is a failure such that the electrodes are vibrated by surface waves or the like, thereby causing mechanical disconnection.

As one of methods for solving the aforesaid problem, there is a method such that a very small quantity of metal such as copper is added to aluminum or some other metallic material that constitutes the electrodes. If about 0.5% by weight of copper is added to aluminum, the time to failure increases several times. If the loading of copper is increased to about 4% by weight, the time to failure extends further.

There is another method in which the conductive films that form the electrodes are stacked in two layers. According to this method, a titanium nitride thin film is formed on a piezoelectric substrate, and an aluminum film is formed thereon, for example. This arrangement improves the problem of electro-migration or stress migration.

According to the method in which copper or some other metal is added, the resistance of the conductive films that form the electrodes is increased by the addition of the metal, so that the insertion loss characteristic of a surface acoustic wave filter, one of the basic characteristics thereof, worsens. For this reason, the loading of copper cannot be increased. In the conventional surface acoustic wave filter, therefore, the electrodes sometimes may be destroyed by input power of only about 1 W despite the addition of copper.

In the case of the method in which the conductive films are stacked in two layers, moreover, upper and lower layers are formed of aluminum and titanium nitride, respectively, for example. In this case, a gas, e.g., boron trichloride or chlorine gas, used in etching aluminum in the upper layer cannot be used to etch titanium nitride in the lower layer. Therefore, forming predetermined electrode patterns by etching the conductive films requires dedicated safety equipment, such as a gas line or purifier, for titanium nitride etching. Accordingly, the investment in this equipment and maintenance expenses increase, thus raising the manufacturing cost of products.

In the surface acoustic wave filter, as mentioned before, input and output electrical signals are processed by utilizing mechanical vibration or so-called surface vibration of that region of the piezoelectric substrate in which input and output electrodes are formed and conversion into voltages or other electrical signals. In this case, the film thickness of the conductive films is settled depending on the required electrical properties.

The properties of surface acoustic waves that propagate through the piezoelectric substrate vary depending on the presence of the conductive films on the piezoelectric substrate. They also vary depending on the mass and thickness of the conductive films on the piezoelectric substrate. The thickness of the conductive films has a value corresponding to a desired frequency characteristic, which is substantially inversely proportional to the frequency and proportional to the wavelength.

In the case where $LiTaO_3$ is used for the piezoelectric substrate, for example, the film thickness of aluminum that forms the conductive films should be about 150 nm in order to obtain the frequency characteristic in the GHz zone. In order to obtain the frequency characteristic of 400 MHz or thereabout, the film thickness of aluminum should be about 550 nm.

In the surface acoustic wave filter described above, the thickness of the electrode fingers formed on the piezoelectric substrate is settled depending on the required frequency characteristic. However, the electrode pads and bus bars should have a great film thickness in consideration of their purposes. For example, metal wires are connected to the electrode pads. Steady bonding with the metal wires requires the thickness of 300 nm or more. The bus bars are utilized for signal conduction. In this case, a lower electric resistance and greater film thickness are preferred in order to reduce the insertion loss.

In the conventional surface acoustic wave filter, however, the individual electrodes, such as the electrode fingers, electrode pads, and bus bars, are all formed in the same process. Therefore, the respective thickness of the conductive films of the electrode pads and bus bars are defined by the film thickness of the electrode fingers that is settle depending on the required frequency characteristic. If the film thickness of the electrode fingers is reduced with the enhancement of the frequency characteristic or the like, the electrode pads and bus bars are also thinned. In consequence, the bonding with the metal wires becomes unsteady or the insertion loss becomes greater, so that the reliability lowers, and the electrical properties worsen.

If the width of the electrode fingers becomes finer with the enhancement of the frequency characteristic, moreover, static electricity may accumulate between the paired electrode fingers that constitute the input and output electrodes, thereby destroying the input and output electrodes, in some cases. As a method for preventing such destruction, there is a method in which the bus bars to which the paired electrode fingers are connected in common are connected by means of a metallized portion that has a resistance of 300 to several k$\Omega$ or more. In this case, however, the width of the metallized portion is as small as about 10 $\mu$m. In a manufacturing process or the like, therefore, the metallized portion may possibly be disconnected.

Normally, a chip that constitutes a surface acoustic wave filter element is stored in a ceramic package. In this case, electrode pads of the surface acoustic wave filter element and an external circuit are connected by wire-bonding using metallic wires of gold or aluminum. In the case of this method, a side wall portion or the like of the package is provided with connecting pads for connection with the metallic wires. Thus, the connecting pads require an installation space, thereby adding to the size of the package and making it difficult to miniaturize the surface acoustic wave filter.

Accordingly, the flip-chip bonding technique is used to reduce the size of the package. This is a method such that bumps of gold or the like formed on the electrode pads of the surface acoustic wave filter element are used for connection with the external circuit. According to this method, the connecting pads are unnecessary, so that the package can be reduced in size.

When using the flip-chip bonding technique, compared to the wire-bonding, however, the electrode pads are subjected to a great force when the electrode pads and the external circuit are connected. If the film thickness of the electrode pads is reduced by the enhanced frequency characteristic of the surface acoustic wave filter, therefore, an external force may reach the piezoelectric substrate, thereby damaging the piezoelectric substrate, in some cases. This may possibly be avoided by increasing the film thickness of the electrode pads with use of the lift-off method. If the film thickness of the electrode pads is increased by the lift-off method, however, a problem arises such that the conductive films that form the electrode pads and conductive films stacked in layers by the lift-off method should be separated.

With the enhancement of the frequency characteristic, as mentioned before, the conventional surface acoustic wave filter has come to be expected to cope with electro-migration and stress migration. Further, the mechanical strength of the electrode pads and the electrical properties of the bus bars must be improved. Moreover, a measure is needed to counter the electrostatic destruction of the input and output electrodes.

SUMMARY OF THE INVENTION

The object of the present invention is to provide a surface acoustic wave filter capable of solving the above problems and adapted for the enhancement of the frequency characteristic and a method for manufacturing the same.

BRIEF DESCRIPTION OF THE DRAWINGS

FIG. 4 is a diagram for illustrating the composition ratio between tantalum and aluminum that form the conductive film;

FIGS. 14(a)–14(f) are manufacturing process diagrams for illustrating another embodiment of the invention;

DETAILED DESCRIPTION OF THE PREFERRED EMBODIMENTS

Figure 1:
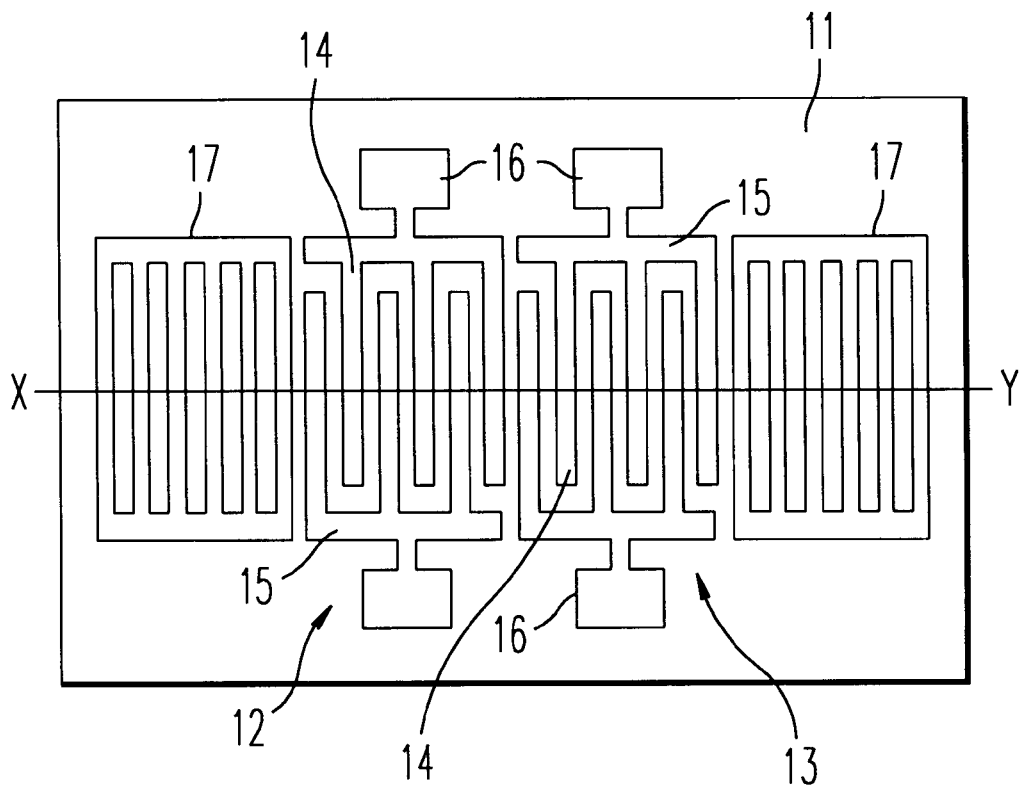
FIG. 1 is a pattern diagram of a conductive film for illustrating an embodiment of the present invention.

An embodiment of the present invention will be described with reference to FIG. 1. Numeral 11 denotes a piezoelectric substrate. LiTaO$_3$ (lithium tantalate) is used as the material of the piezoelectric substrate 11, for example. An input transducer 12 and an output transducer 13, formed of a plurality of combed-type electrode fingers 14, are arranged on the piezoelectric substrate 11. The electrode fingers 14 are connected in common by means of bus bars 15, which are connected to electrode pads 16. Grating electrodes 17 is formed outside the input and output electrodes 12 and 13. Conductive films of the electrode fingers 14, bus bars 15, electrode pads 16, grating electrodes 17, etc. are all formed having a predetermined pattern on the piezoelectric substrate 11. Referring now to the sectional view of FIG. 2 taken along line X–Y of FIG. 1, there will be described the configuration of the conductive films formed on the piezoelectric substrate 11. Numeral 11 denotes the piezoelectric substrate. A conductive film 21 is formed on the piezotlectric substrate 11. The conductive film 21 has a two-layer structure, including a first layer 21a and a second layer 21b. The first layer 21a is formed on the piezoelectric substrate 11, and contains at least tantalum and aluminum. The second layer 21b is formed on the first layer 21a, and contains at least aluminum or an alloy consisting mainly of aluminum.

The resistance of a tantalum-aluminum film is higher than that of pure aluminum. If the film thickness of the tantalum-aluminum film is not greater than 300 angstroms (30 nm), however, the film exerts no substantial influence on the electrical properties of a surface acoustic wave filter element, thus arousing no problem.

Figure 2:
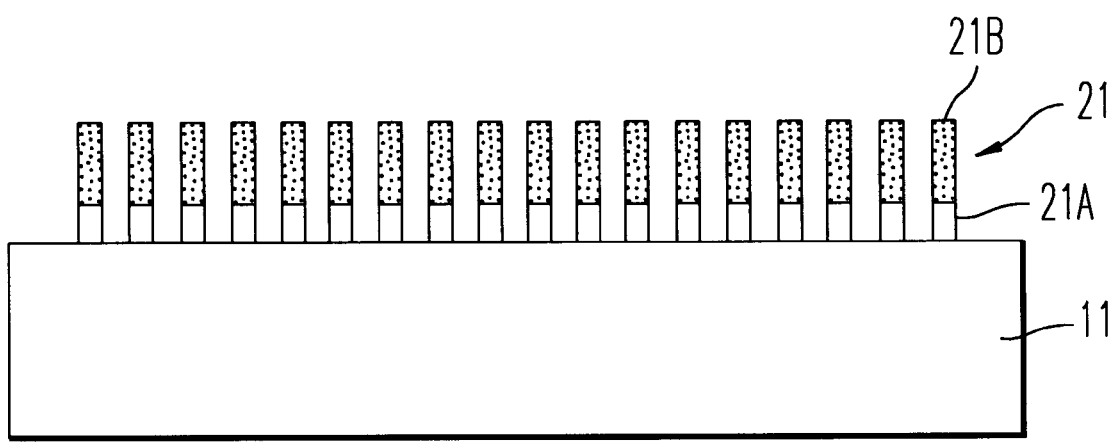
FIG. 2 is a sectional view of a conductive film portion for illustrating the embodiment of the invention.

Referring now to the numerals used in FIG. 2, there will be described a method for manufacturing the surface acoustic wave filter element having the aforesaid construction.

First, the wafer surface of the piezoelectric substrate 11 is washed in pure water, for example. Then, the wafer surface is dried by using a dry spinner. Thereafter, the conductive film 21 is formed having a predetermined film thickness on the piezoelectric substrate 11. The conductive film 21 is formed by the sputtering method, for example.

In forming the conductive film 21 by the sputtering method, the wafer of the piezoelectric substrate 11 having the washed surface is set in a sputtering device, and a tantalum-aluminum film as the first layer 21a is formed, for example. The tantalum-aluminum film is formed by means of a target that is formed by combining small pieces of tantalum and aluminum. The small pieces of tantalum and aluminum are arranged on a backing plate of the target. The composition ratio of the tantalum-aluminum film is controlled in accordance with the ratio between the respective surface areas of the small pieces of tantalum and aluminum on the target. In this case, the composition ratio of the tantalum-aluminum film and the area ratio between the small pieces are not always equal. Since the composition ratio does not substantially change with time, the control of the composition ratio is easy, so that a desired composition ratio can be realized with ease.

Thereafter, an aluminum film as the second layer 21b, for example, is formed on the tantalum-aluminum film with the surface of the wafer having the tantalum-aluminum film thereon not exposed to the atmosphere and kept in a vacuum. If the wafer having the tantalum-aluminum film thereon is exposed to the atmosphere before the aluminum film is formed, in this case, an oxide film is formed on the surface layer of the tantalum-aluminum film, so that the orientation of the aluminum film becomes poorer. Thus, the aluminum film is formed without being exposed to the atmosphere after the tantalum-aluminum film is formed.

After the two-layer conductive film 21, including the tantalum-aluminum film and aluminum film, is formed in the aforesaid manner, predetermined resist patterns are formed corresponding to the individual electrodes, the electrode fingers that constitute the input and output electrodes, electrode pads, bus bars, grating reflector, etc., by photolithography. Then, the patterns are etched, and the conductive film 21 is formed having a shape corresponding to the individual electrode patterns.

For example, the reactive-ion etching method is used for this process of etching. According to this method, the tantalum-aluminum film as the second layer 21a can be etched without substantially changing the conditions for etching the aluminum film as the second layer 21b or etching gas. Thus, the electrode patterns can be formed with ease.

After the etching is finished, the resist is separated. Thereafter, the chip obtained by cutting down the element on the wafer to a given size is located in the package. Then, electrical connection is made by wire-bonding and the resulting structure is sealed in a nitrogen atmosphere, whereupon the surface acoustic wave filter is completed.

Referring now to FIG. 3, there will be described the construction of the target for the case where the tantalum-aluminum film is formed by sputtering in the aforementioned manufacturing process.

Figure 3A:
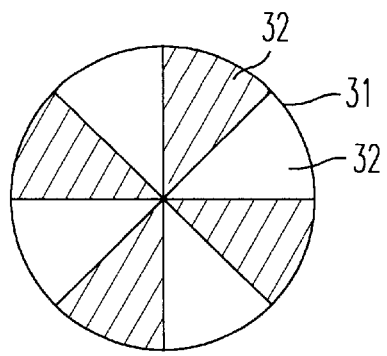
FIGS. 3(a)–3(e) are diagrams for illustrating a target used in the invention.
Figure 3B:
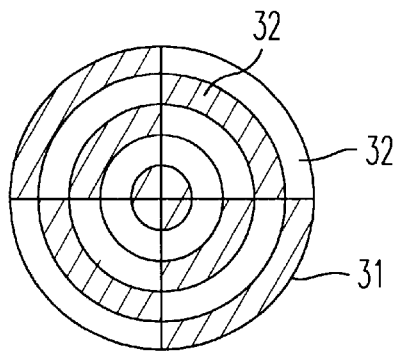
Figure 3C:
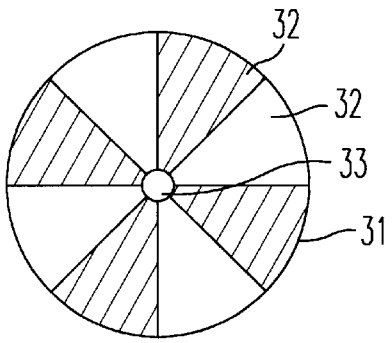
Figure 3D:
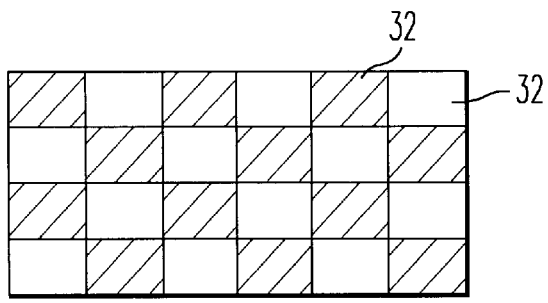
Figure 3E:
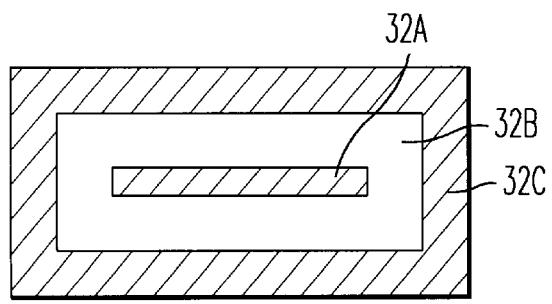

FIGS. 3(a) to 3(c) show examples of a circular target, while FIGS. 3(d) and 3(e) show examples of a rectangular target. Hatched portions are regions in which the small pieces of tantalum are arranged, while blank portions are regions in which the small pieces of aluminum are arranged.

FIG. 3(a) shows a circle 31 that is divided into a plurality of regions 32 in the radial direction, in which a plurality of small pieces of tantalum and a plurality of small pieces of aluminum are arranged alternately. Further, FIG. 3(b) shows a circle 31 that is divided into a plurality of regions 32 in the radial and circumferential directions, in which small pieces of tantalum and small pieces of aluminum are arranged alternately in both of the radial and circumferential directions. Moreover, FIG. 3(c) shows a circle 31 that is divided into a plurality of regions 32 in the radial direction, in which small pieces of tantalum and small pieces of aluminum are arranged alternately in a plurality of regions. A small piece of either tantalum or aluminum is located in a central portion 33 of the circle 31. In the case of this configuration, the respective pointed portions of the small pieces of tantalum and aluminum are not concentrated on the central portion of the circle, so that the small pieces of tantalum and aluminum can be arranged with ease.

FIG. 3(d) shows a rectangle that is divided into a plurality of regions 32 in both of vertical and horizontal directions, in which a plurality of small pieces of tantalum and aluminum are arranged alternately. FIG. 3(e) shows a rectangle that is divided into a plurality of regions, including a central rectangular region 32a, a fixed-width region 32b surrounding the rectangular region 32a, and a fixed-width region 32c extending along the edge of the rectangle, in which small pieces of tantalum and aluminum are not arranged in adjacent regions.

If the small pieces of tantalum and aluminum are arranged alternately in a plurality of regions, as shown in FIGS. 3(a) and 3(e), the arrangement of the small pieces of tantalum and aluminum is well balanced, so that a tantalum-aluminum film with uniform characteristics can be formed.

Referring now to FIG. 4, there will be described the crystal orientation of the aforementioned structure. FIG. 4 shows the relation between the composition ratio (atomic percentage) between tantalum and aluminum of the tantalum-aluminum film in the lower layer and the crystal orientation of the aluminum film in the upper layer. This is the result of measurement based on the X-ray diffraction analysis. The crystal orientation of the aluminum film represents the full width at half maximum (FWHM) of (111) orientation based on the X-ray diffraction analysis.

As is evident from the relation of FIG. 4, the full width at half maximum is reduced, indicating a high degree of orientation, in the area where the composition ratio of tantalum ranges from 39% to 75% (atomic percentage). In the area where the composition ratio of tantalum ranges from 45% to 75% (atomic percentage), moreover, the full width at half maximum is further reduced, indicating a high degree of orientation. In the area where the composition ratio of tantalum ranges from 48% to 64% (atomic percentage), furthermore, the full width at half maximum is additionally reduced, indicating a higher degree of orientation. In the areas where high orientation can be restrained, occurrence of stress migration, electro-migration, etc. can be restrained, so that electric power resistance can be improved.

In the embodiment described above, $LiTaO_3$ is used for the piezoelectric substrate. Alternatively, however, $LiNbO_3$, $Li_2B_4O_7$, quartz, etc. may be used for the piezoelectric substrate. Although the upper layer of the conductive film is formed of aluminum, moreover, it may alternatively be formed of an alloy constituting mainly of aluminum or any other metal.

Figure 5:
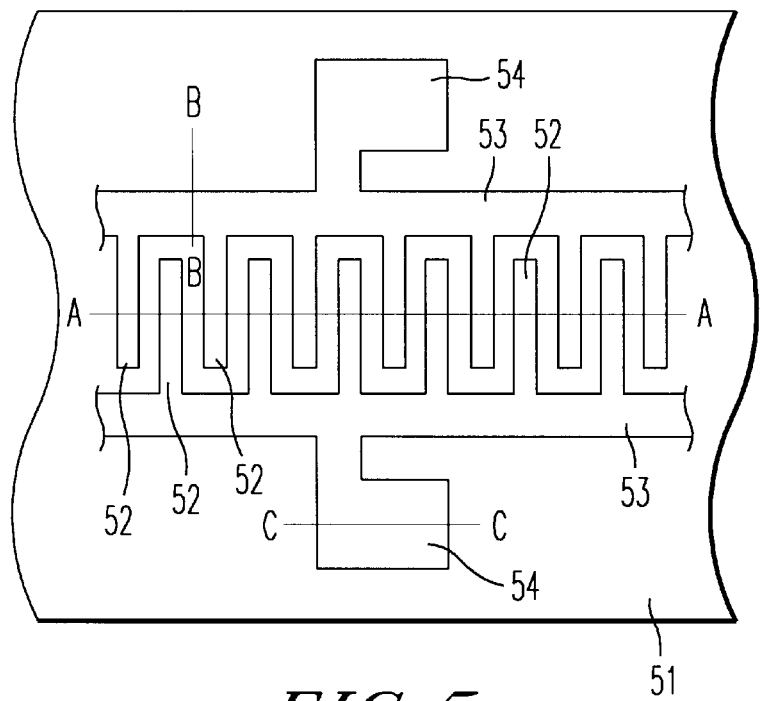
FIG. 5 is a pattern diagram of a conductive film for partially illustrating another embodiment of the invention.

Referring to FIG. 5, there will be described another embodiment of the present invention. Numeral 51 denotes a piezoelectric substrate, which is formed of $LiTaO_3$, $LiNbO_3$, or quartz. A plurality of electrode fingers 52, which constitute input or output electrodes, are formed on the piezoelectric substrate 51. The electrode fingers 52 are connected in common by means of bus bars 53, which are connected to electrode pads 54. The electrode fingers 52 extend from opposite sides and cross one another like comb teeth.

Referring now to FIG. 6, there will be described the respective profiles of the electrode fingers 52, bus bar 53, and electrode pad 54. Like numerals in FIG. 6 are used to designate those portions which have their corresponding portions in FIG. 5, and a repeated description of those portions is omitted.

Figure 6A:
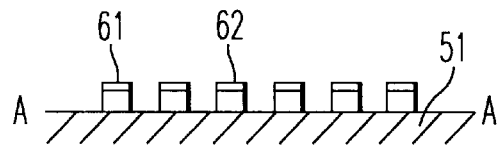
FIGS. 6(a)–6(c) are sectional views of a conductive film portion for illustrating another embodiment of the invention.

FIG. 6(a) is a sectional view taken along line A—A of FIG. 5, and shows the profiles of the electrode fingers 52. In each electrode finger 52, a first layer 61 of a material constituting mainly of aluminum, e.g., simple aluminum or a material obtained by adding copper and silicon to aluminum, is formed on the piezoelectric substrate 51, and an intermediate layer is formed thin on the first layer 61. The thickness of the first layer 61 is settled depending on the frequency characteristic that is required in designing the electrode fingers. In the case where a 1.5-GHz band filter is formed on a piezoelectric substrate of $LiTaO_3$, for example, the thickness of the first layer 61 is about 150 nm.

The intermediate layer 62 is formed of a material consisting mainly of any other metal than aluminum, e.g., a high-melting metal, such as tungsten, molybdenum, titanium, or tantalum, or a metallic compound containing the high-melting metal. In this case, a titanium-tungsten alloy is used, and its thickness is as small as 20 nm. The intermediate layer 62 may be formed by stacking titanium and tungsten by turns instead of using the titanium-tungsten alloy. In the process of manufacture, a second layer (not shown) of aluminum is formed on the intermediate layer 62, as mentioned later. However, the second layer is etched in the process of forming the electrode fingers 52, and finally remains no longer.

According to the arrangement described above, each electrode finger 52 is not of a single-layer structure, but has a structure such that the first layer 61 is coated with a film of the titanium-tungsten alloy. Thus, the electric power resistance and migration resistance are improved.

Figure 6B:
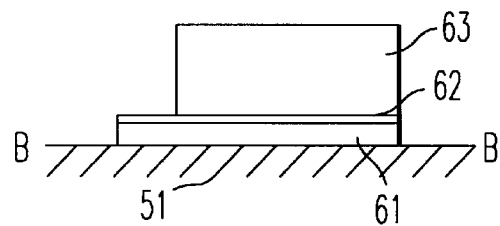

FIG. 6(b) is a sectional view taken along line B—B of FIG. 5, and shows the profile of the bus bar 53. The bus bar 53 is formed of the first layer 61 and the intermediate layer 62, consisting mainly of aluminum, and a second layer 63 consisting mainly of aluminum and partially formed on the intermediate layer 62, for example. The second layer 63, having a thickness of 600 nm, is thicker than the first layer 61. In consequence, the electric resistance of the portion corresponding to the bus bar 53 is lowered to about ⅕, as compared to the case where only the first layer 61 is used. Thus, the insertion loss of the surface acoustic wave filter is small.

In the case of FIG. 6(b), the second layer 63 partially remains on the intermediate layer 62. In the present invention, however, the pattern for the electrode fingers 52 is formed in the process of patterning the intermediate layer 62 and the first layer 61 after patterning for the partial removal of the second layer 63. If that portion of the second layer 63 near the electrode fingers 52 is designed to be partially removed, therefore, uneven application of the resist can be avoided in patterning the electrode fingers 52.

If the pitch of the electrode fingers 52 is so rough that the influence of uneven application of the resist can be ignored, or in the case where the second layer for the portions corresponding to the electrode fingers 52 is removed after patterning the portions for the electrode fingers 52, bus bars 51, and electrode pads 54 by using a high-directivity etching method, the second layer may be designed to remain over the whole region of the bus bar 53.

Figure 6C:
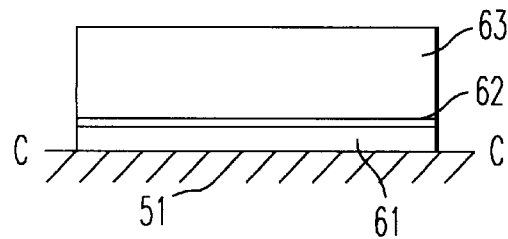

FIG. 6(c) is a sectional view taken along line C—C of FIG. 5, and shows the profile of the electrode pad 54. The electrode pad 54 is formed of the first layer 61 and the intermediate layer 62, consisting mainly of aluminum, and a second layer 63 consisting mainly of aluminum. In this case, the second layer 63 remains substantially over the whole region of the electrode pad 54. The thickness of the second layer 63 is adjusted to 600 nm. Since the second layer 63 is thick enough to ensure good mechanical strength, it can be coupled satisfactorily to the metallic wires, thus enjoying improved stability and reliability.

In the embodiment described above, each electrode finger 52 is formed in two layers, while each bus bar 53 and each electrode pad 54 are formed in three layers. Alternatively, however, each of the portions for the electrode fingers 52, bus bars 53, and electrode pads 54 may be formed in more layers.

Referring now to FIG. 7, there will be description another embodiment of the present invention in which a portion for each electrode finger is formed in three layers, and each of portions for each bus bar and each electrode pad is formed in four layers. Like numerals in FIG. 7 are used to designate those portions which have their corresponding portions in FIGS. 5 and 6, and a repeated description of those portions is partially omitted.

Figure 7A:
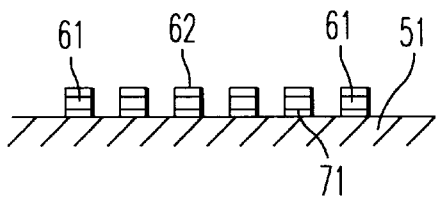
FIGS. 7(a)–7(c) are sectional views of a conductive film portion for illustrating another embodiment of the invention.

FIG. 7(a) is a sectional view of electrode finger portions. An under layer 71 is formed on the piezoelectric substrate 51. The under layer 71 is formed in order to improve the bonding properties for the piezoelectric substrate 51, the film quality of the first layer 61, and the electric power resistance. The under layer 71 is obtained by depositing titanium-aluminum to a thickness of 10 nm. The first layer 61 consisting mainly of aluminum is formed on the under layer 71, and the intermediate layer 62 is formed thin thereon.

The thickness of the first layer 61 is settled depending on the frequency characteristic that is required in designing the electrode fingers 52. In the case where a 1.5-GHz band filter is formed on the piezoelectric substrate 11 of $LiTaO_3$, for example, the thickness of the first layer 61 is about 150 nm. The intermediate layer 62 is formed of titanium-tungsten, and its thickness is adjusted to 20 nm. The intermediate layer 62 is formed of a material consisting mainly of any other high-melting metal than aluminum, for example. The material may be a simple film of tungsten or molybdenum or a film of a compound consisting mainly of a high-melting metal, for example. In the process of manufacture, a second layer consisting mainly of aluminum is formed on the intermediate layer 62, as mentioned later. However, the second layer is etched as the electrode fingers 52 are formed, and finally remains no longer.

According to the arrangement described above, each electrode finger 52 is not a single-layer film, but has a sandwich structure interposed between the under layer 71 and the intermediate layer 62. Thus, the electric power resistance and migration resistance are further improved.

Figure 7B:
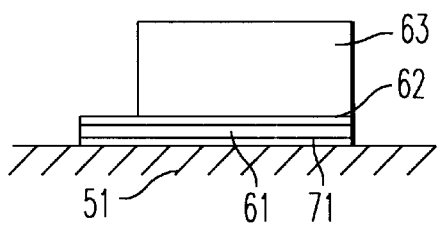
Figure 7C:
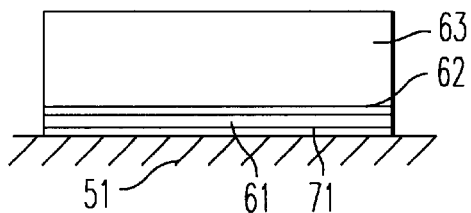

FIG. 7(b) is a sectional view of a bus bar portion. The under layer 71 is formed on the piezoelectric substrate 51. FIG. 7(c) is a sectional view of an electrode pad portion. Also in this case, the under layer 71 is formed on the piezoelectric substrate 51.

Figure 8:
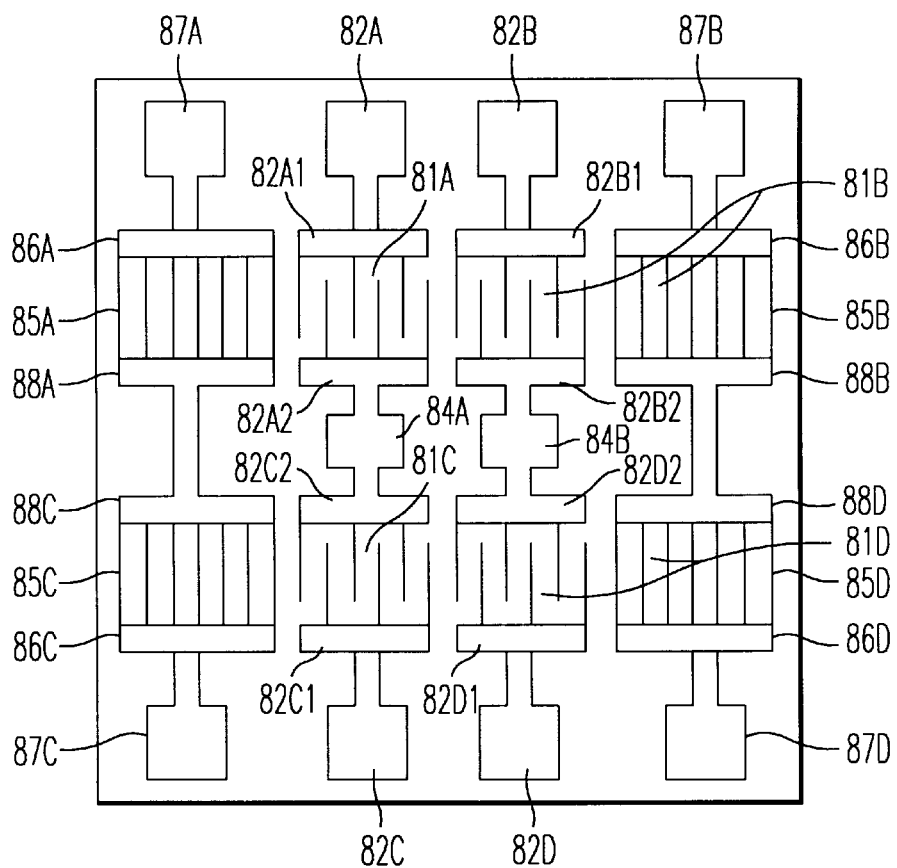
FIG. 8 is a pattern diagram of a conductive film for illustrating another embodiment of the invention.

Referring now to FIG. 8, there will be description another embodiment of the present invention in which a plurality of electrode fingers are formed on the piezoelectric substrate. In this embodiment, electrode fingers 81A to 81D are formed individually in four regions on the piezoelectric substrate 51. Bus bars 82A1 to 82D1, which connect the four electrode fingers 81A to 81D in common on one side, are connected to electrode pads 82A to 82D, respectively, by means of a conductive pattern.

Among bus bars 82A2 to 82D2 that connect the other side in common, the bus bars 82A2 and 82C2 are connected to each other by means of an electrode pad 84A, while the bus bars 82B2 and 82D2 are connected to each other by means of an electrode pad 84B. The two electrode fingers 81A and 81B are formed having the same film thickness. Further, the two electrode fingers 81C and 81D are formed having the same film thickness, which is different from that of the fingers 81A and 81B.

Grating reflectors 85A to 85D having an electrode grid pattern are provided on the left and right of the four electrode fingers 52 81A to 81D. The grating reflectors 85A to 85D are connected to electrode pads 87A to 87D by means of bus bars 86A to 86D on the one side. Among bus bars 88A to 88D on the other side of the grating reflectors 85A to 85D, the bus bars 88A and 88C are connected to each other, while the bus bars 88B and 88D are connected to each other.

Referring now to FIG. 9, there will be described a partial profile of the surface acoustic wave filter element having the aforementioned construction. Like numerals in FIG. 9 are used to designate those portions which have their corresponding portions in FIGS. 5 to 8, and a repeated description of those portions is partially omitted.

Figure 9A:
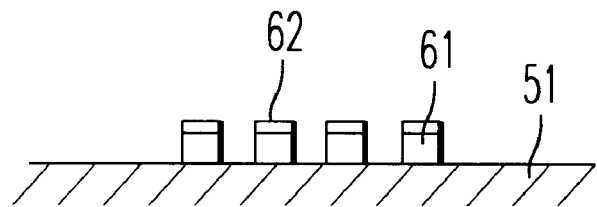
FIGS. 9(a)–9(c) are sectional views of a conductive film portion for illustrating another embodiment of the invention.

FIG. 9(a) is a sectional view showing portions for the electrode fingers 81A and 81B. This structure is a laminate structure that include the first layer 61 and the first intermediate layer 62, consisting mainly of aluminum. The overall thickness is about 160 nm.

Figure 9B:
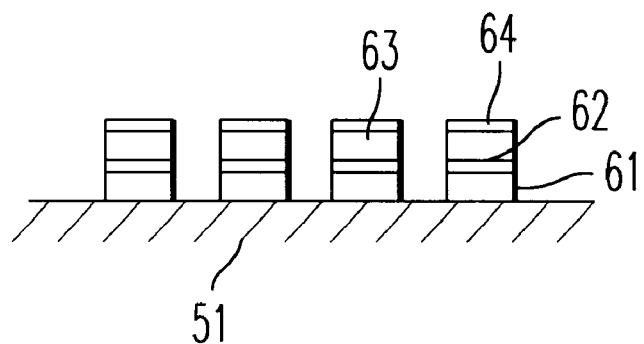

FIG. 9(b) is a sectional view showing portions for the electrode fingers 81C and 81D. In this structure, the second layer 63 consisting mainly of aluminum and a second intermediate layer 64 consisting mainly of a high-melting metal other than aluminum are further formed on the first layer 61 and the first intermediate layer 62, which constitute mainly of aluminum. The overall thickness is about 270 nm.

Figure 9C:
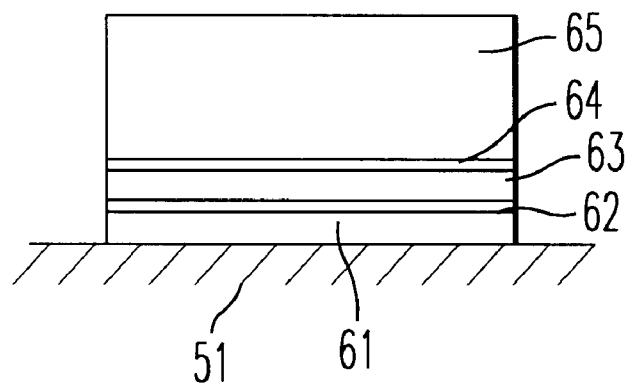

FIG. 9(c) is a sectional view of an electrode pad portion. In this structure, the first layer 61, first intermediate layer 62, second layer 63, and second intermediate layer 64 are formed on the piezoalectric substrate 51, and a third layer 65 consisting mainly of aluminum is further formed having a thickness of 500 nm on the second intermediate layer 64. The third layer 65 is formed of aluminum only, while the first and second layers 61 and 63 are loaded with 0.5% of copper and silicon, respectively, whereby the electric power resistance of the electrode finger portions is improved. In this case, the laminate structure is also conducive to the improvement of the electric power resistance.

The first layer 61 is 150 nm thick, and the second layer 63 is 100 nm thick. Both the first and second intermediate layers 62 and 64 are as thin as 10 to 20 nm, and titanium-tungsten is used as their material. However, the intermediate layers 62 and 64 may be formed of a simple metal, such as tungsten, titanium, tantalum, or molybdenum, or a compound consisting mainly of any of these metals. The intermediate layers 62 and 64 are so thin that their resistivity arouses no problem. Therefore, a compound such as titanium nitride may be used as their material.

According to the arrangement described above, a plurality of types of filters having different frequency characteristics can be provided on a single piezoelectric substrate, for example. Thus, surface acoustic wave filters having various properties can be easily constructed by combining the frequency characteristics.

Referring now to FIG. 10, there will be described an example of a manufacturing method according to the present invention.

Figure 10A:
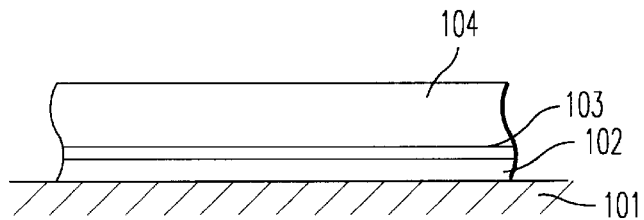
FIGS. 10(a)–10(e) are manufacturing process diagrams for illustrating another embodiment of the invention.

First, a first layer 102 consisting mainly of aluminum is formed on a piezoelectric substrate 101 of $LiTaO_3$ or the like, and an intermediate layer 103 of titanium-tungsten and a second layer 104 consisting mainly of aluminum are successively formed over the first layer 102 by the sputtering method, for example, as shown in FIG. 10(a). When using the sputtering method, targets corresponding to the metals of the individual layers are opposed to the piezoelectric substrate 101, for example, and argon plasma is applied to the targets, whereupon a desired metallic layer is formed on the piezoelectric substrate 101.

The first and second layers 102 and 104 are obtained by adding 0.5% of copper and silicon to aluminum so that their electric power resistance and migration resistance are improved. The intermediate layer 103 is obtained by forming titanium-tungsten to a thickness of 20 nm. Alternatively, however, the intermediate layer 103 may be formed by successively sputtering titanium and tungsten. In this case, the intermediate layer 103 is a laminate structure of titanium and tungsten layers.

The thickness of the first layer 102 is adjusted to, for example, 150 nm in consideration of the frequency characteristic of electrode fingers. When constructing electrode fingers that require a desired frequency characteristic, the thickness of the second layer 104 is set at a value corresponding to that frequency characteristic. In the case of electrode pads that are intended for connection with metallic wires or bus bars for signal conduction, however, the second layer 104 is made as thick as possible or adjusted to a thickness of about 500 nm, for example, so that its properties are improved. Instead of the sputtering method, the vacuum evaporation method or CVD method may be used for the formation of the first layer 102, intermediate layer 103, and second layer 104.

Figure 10B:
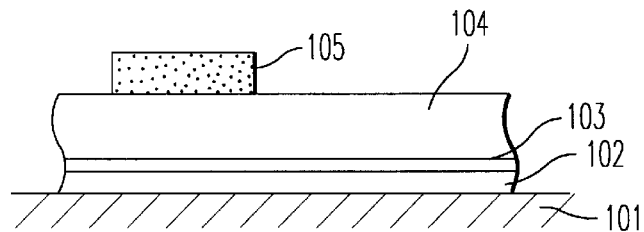

Then, a resist is applied to the surface, and mask exposure and development are effected, whereupon a specific resist pattern 105 is formed on the second layer 104, as shown in FIG. 10(b).

Figure 10C:
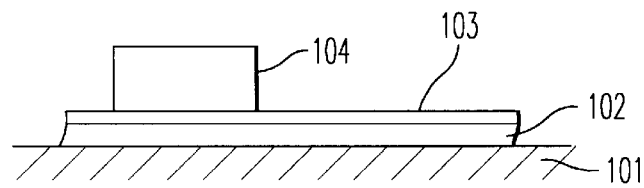

Using the resist pattern 105 as a mask, thereafter, the second layer 104 is etched, the resist pattern 105 is removed, and the second layer 104 is patterned, as shown in FIG. 10(c).

At this time, the second layer 104 is etched by dry etching based on the RIE (reactive-ion etching) method, for example. In this case, $BCl_3$ or $CCl_4$ and $O_2$ are used as etching gases. Any other chlorine-based gases may be used for dry etching. Further, $Cl_2$, $N_2$, $O_2$ etc. may be used as additive gases. Wet etching may be used in place of dry etching.

The intermediate layer 103 functions as a stopper layer. In the case of dry etching using the aforesaid gases, the etching rate of the second layer 104 is different from that of the intermediate layer 103, so that the intermediate layer 103 forms a barrier against the etching lest the first layer 102 be removed. Thus, the film thickness of the first layer 102 that is required to secure the properties of the electrode fingers, and uniform stable properties can be realized.

Since no intermediate layer is used in the prior art case, there is no stopper function against etching. In some cases, therefore, part of the aluminum layer to be left in the lower layer may be removed to worsen the film thickness accuracy, so that uniform properties cannot be obtained.

Figure 10D:
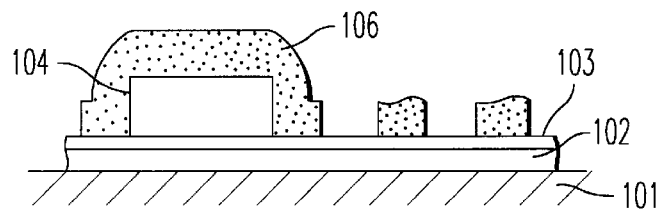
Figure 10E:
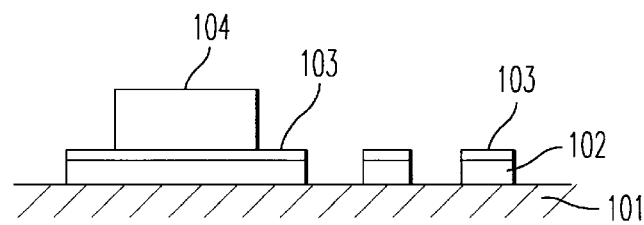

Then, after a resist is applied to the surface, and mask expo sure and development are effected, whereupon a resist pattern 106 for electrode fingers is formed, as shown in FIG. 10(d).

Using the resist pattern 106 as a mask, thereafter, the intermediate layer 103 and the first layer 102 are etched and the resist pattern 106 is removed, whereupon patterning the electrode fingers is finished.

In the case described above, the intermediate layer 103 and the first layer 102 are etched by dry etching based on the RIE (reactive-ion etching) method. Further, $CF_4$ is used as an etching gas for the intermediate layer 103. In the case where the intermediate layer 103 is formed of titanium, tungsten, molybdenum, etc., gases of the same ad system, such as $CF_4$, $SF_6$, $NF_3$, etc., can be used. In this case, additive gases, such as argon, $N_2$, $O_2$, etc., may be mixed for the adjustment of the shape properties and the like.

In the case of a $CF_4$-based gas, the first layer 102 consisting mainly of aluminum cannot be etched. As in the case of the second layer 104, therefore, the RIE is effected with use of $BCl_3$ and $O_2$ as etching gases.

In the procedure described above, the electrode fingers and electrode pads may be patterned the other way around. However, the aforesaid order is advantageous because the aspect ratio and shape properties for the formation of the electrode fingers cannot be secured favorably in this case.

In the aforementioned process, moreover, the CDE chemical dry etching) method may, for example, be used in place of the dry etching. However, the RIE method is superior to the CDE method in anisotropy. Accordingly, the RIE method is advantageous in securing the shape properties, such as the pattern accuracy, aspect ratio, etc. Further, the wet etching method may be used in the case where the pattern shape properties are generous.

In the embodiment described above, the electric power resistance and migration resistance are improved by leaving the intermediate layer thin on the first layer that constitutes the electrode fingers. Depending on the application of the surface acoustic wave filter, however, the intermediate layer on the electrode fingers may be removed.

In this case, the intermediate layer can be removed by changing the etching gas over to $CF_4$ or the like after dry-etching the second layer.

In the embodiment described above, $LiTaO_3$ is used for the piezoelectric substrate. Alternatively, however, $LiNbO_3$, $Li_2B_4O_7$, quartz, $La_3Ga_5SiO_{14}$, etc. may be used as the material of the piezoelectric substrate. The present invention may be also applied to a piezoelectric substrate in which a thin film of ZnO or the like is formed on a glass substrate.

Figure 11:
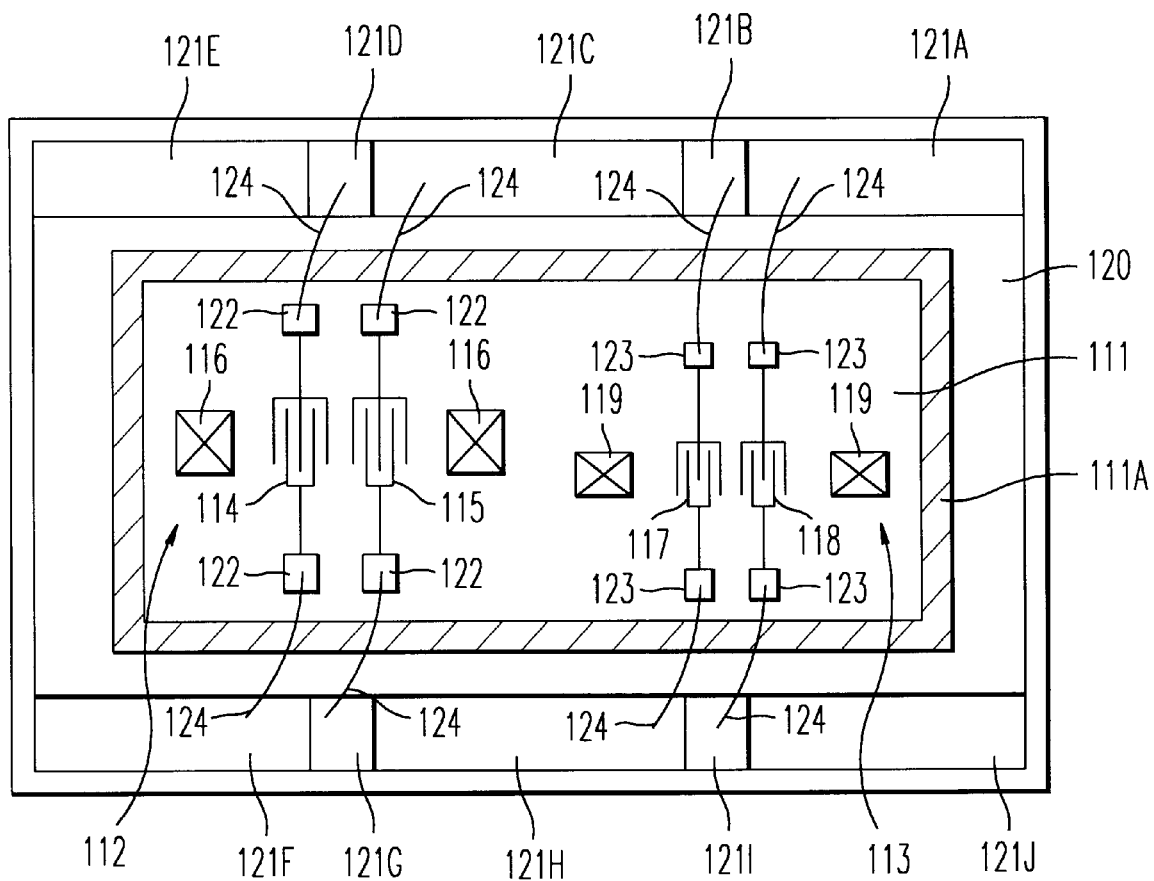
FIG. 11 is a plan view for illustrating another embodiment of the invention.

Referring to the schematic plan view of FIG. 11, there will be described another embodiment of the present invention.

Numeral 111 denotes a piezoelectric substrate. $LiNbO_3$, $LiTaO_3$, $Li_2B_4B_7$, or quartz may be used for the piezoelectric substrate 111. In this case, 36°-Y-cut, X-direction-propagation $LiTaO_3$ is used. First and second filters 112, surface acoustic wave filter elements, are formed on the piezoelectric substrate 111.

The first filter 112 is composed of combed-type electrode fingers 114 that constitute input electrodes, combed-type electrode fingers 115 that constitute output electrodes, grating reflectors 116, etc. The first filter 112 functions as a 900-MHz band-pass filter, for example. In order to obtain a desired reflectivity, in this case, the film thickness and line width of the electrode fingers and grating reflectors are adjusted to about 310 nm and 1.07 µm, respectively.

The second filter 113 is composed of combed-type electrode fingers 117 that constitute input electrodes, combed-type electrode fingers 118 that constitute output electrodes, grating reflectors 119, etc. The second filter 113 functions as a 1.8-GHz band-pass filter, for example. In order to obtain a desired reflectivity, in this case, the film thickness and line width of the electrode fingers and grating reflectors are adjusted to about 150 nm and 0.5 µm, respectively.

In the embodiment described above, the film thickness and line width of the first filter 112 are different from those of the second filter 113. With this arrangement, the band-pass filters for two different frequency bands are formed on one piezoelectric substrate.

If two surface acoustic wave filter elements are provided on a common piezoelectric substrate, interference may be caused between them in some cases. Such interference can be avoided by providing a surface acoustic wave absorber or groove between the two surface acoustic wave filter elements or deviating the directions of propagation of the respective surface acoustic waves of the surface acoustic wave filter elements.

The surface acoustic wave filter element chip having the above-described construction is housed in a package 120 of, for example, ceramics. If necessary, the chip is mounted having a cutting area 111a for dicing. Connecting pads 121a to 121j on the package 120 and electrode pads 122 and 123 of the surface acoustic wave filter elements are connected by means of metallic wires 124, individually. The chip is sealed in the package 120 by means of a lid (not shown).

The cutting area 111a for dicing of the surface acoustic wave filter element chip is intended to prevent chippings or soil attributable to dicing from affecting the electrode patterns of the surface acoustic wave filter elements, and has a width of about 100 μm.

Referring now to FIG. 12, there will be described a method for manufacturing the aforementioned surface acoustic wave filter element. First, a metallic film including four layers, first to fourth layers is formed on a piezoelectric substrate 10 by the sputtering method, as shown in FIG. 12(a). The first layer is a tantalum-aluminum alloy layer 100, which has a film thickness of about 2 nm. The second layer is an aluminum-copper layer 200 containing 0.5% of copper, which has a film thickness of about 143 nm. The third layer is a tantalum-aluminum alloy layer 300, which has a film thickness of about 5 nm. The fourth layer is an aluminum-copper layer 400 containing 0.5% of copper, which has a film thickness of about 160 nm.

Figure 12A:
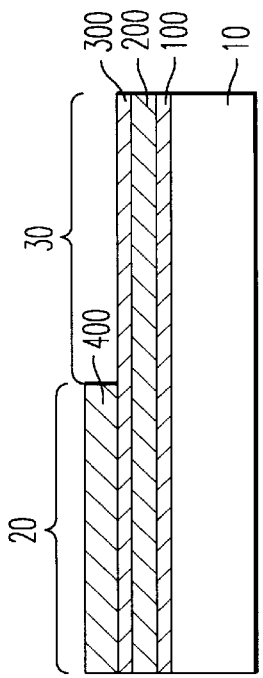
FIGS. 12(a)–12(f) are manufacturing process diagrams for illustrating another embodiment of the invention.
Figure 12B:
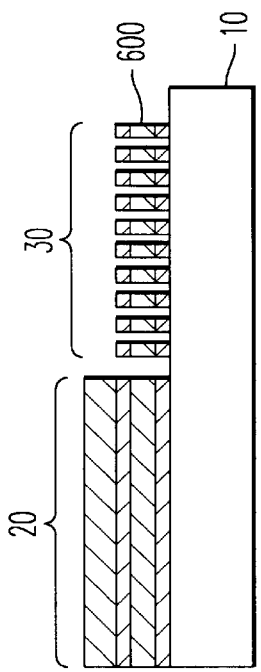
Figure 12C:
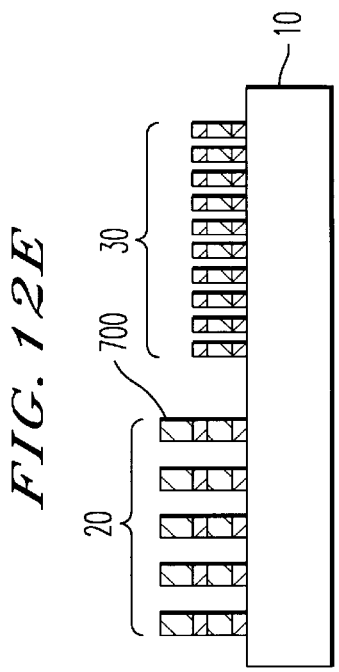

Then, a resist is applied to the whole structure, exposed, and developed, as shown in FIG. 12(b). Thereafter, that portion of the resist on a higher-frequency band area 30 is removed. At this time, the higher-frequency band area 30 is divided from a lower-frequency band area 20, and the lower-frequency band area 20 is coated with a resist 500.

Then, the resulting structure is impregnated with a mixed acid consisting mainly of, for example, phosphoric acid, and that portion of the structure which is not covered by the resist 500, that is, the aluminum-copper layer 400 in the uppermost layer of the higher-frequency band area 30, is removed by etching. As this is done, the tantalum-aluminum alloy is not etched with the mixed acid. Accordingly, only the uppermost layer is etched, and the tantalum-aluminum alloy layer as the third layer and the layers thereunder remain in the higher-frequency band area 30.

Figure 12D:
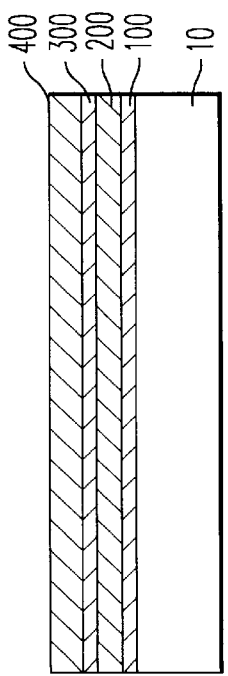

Then, the resist is removed, as shown in FIG. 12(d). Thereupon, a thick film remains in the lower-frequency band area 20, while a thin film remains in the higher-frequency band area 30.

According to the method described above, only the uppermost layer is etched with the mixed acid, and the tantalum-aluminum alloy is not. Thus, the thickness of the film in the higher-frequency band area 30 is kept constant without being changed by the etching.

Subsequently, electrode formation in the higher-frequency band area 30 is effected. After the whole structure is first coated with the resist, the resist is exposed and developed to form a resist pattern in the higher-frequency band area 30.

Then, the metallic film is etched by the reactive-ion etching method using, for example, $Cl_2$ gas. Thereupon, the tantalum-aluminum alloy layer as the third layer, aluminum-copper layer as the second layer, and tantalum-aluminum alloy layer as the first layer are etched at a time.

Figure 12E:
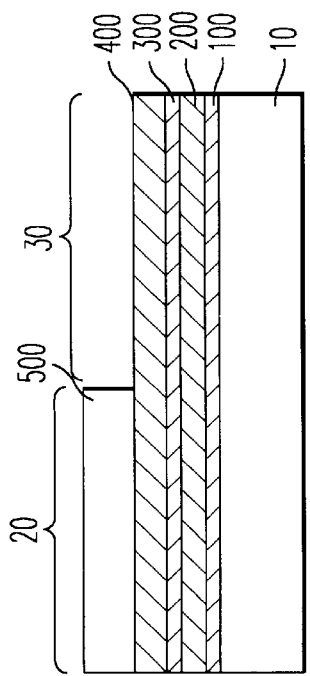

If the resist is then removed, an electrode pattern 600 is formed in the higher-frequency band area 30, as shown in FIG. 12(e).

Thereafter, electrode formation in the lower-frequency band area 20 is effected. This method is carried out substantially in the same manner as the method of electrode formation in the higher-frequency band area 30.

First, the whole piezoelectric substrate surface on which the electrode pattern is formed in the higher-frequency band area 30 is coated with the resist. Then, the resist in the lower-frequency band area 20 is exposed and developed to form a resist pattern in the lower-frequency band area 20.

Then, the aluminum-copper layer as the fourth layer, tantalum-aluminum alloy layer as the third layer, aluminum-copper layer as the second layer, and tantalum-aluminum alloy layer as the first layer are etched at a time by the reactive-ion etching method.

Figure 12F:
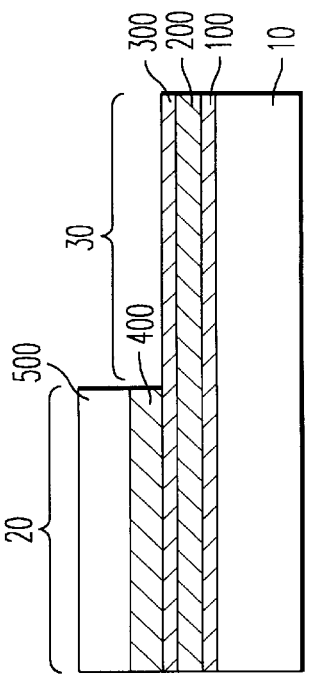

If the resist is removed after the etching, an electrode pattern 700 is formed in the lower-frequency band area 20, as shown in FIG. 12(f).

As described above, the formation of the electrode pattern 600 in the higher-frequency band area 30 and the formation of the electrode pattern 700 in the lower-frequency band area 20 are carried out separately. In this case, a structure can be easily formed such that the electrode patterns 600 and 700 are different in film thickness and line width. Thus, electrode patterns can be formed having optimum film thicknesses and line widths for different frequencies.

In the embodiment described above, the electrode pattern 600 is formed in the higher-frequency band area 30, and the electrode pattern 700 is formed in the lower-frequency band area 20, thereafter. Alternatively, however, the electrode pattern 600 in the higher-frequency band area 30 may be formed after the electrode pattern 700 in the lower-frequency band are a 20 is formed first.

Further, the electrode pattern 600 in the higher-frequency band area 30 and the electrode pattern 700 in the lower-frequency band area 20 may be formed simultaneously.

According to the method described above, metallic patterns with different film thicknesses and line widths can be formed on one piezoelectric substrate. For example, a four-layer electrode with a film thickness of 310 nm and a three-layer electrode with a film thickness of 150 nm are formed in the lower-frequency band area 20 and the higher-frequency band area 30, respectively.

After the electrode patterns are formed, the structure is divided into chips by dicing. Each chip includes the higher-frequency band area 30 and the lower-frequency band area 20. Thus, filters or the like that operate at two frequencies can be formed on each chip.

The chip having the aforesaid construction is mounted in, for example, a ceramic package by using a silicone bonding agent. Thereafter, a connecting pad of the package and an electrode pad of the chip are bonded by means of a metallic wire, and the ceramic package is sealed with a metallic lid, whereupon a surface acoustic wave filter is completed.

According to the embodiment described above, the respective thicknesses of electrodes with different film thicknesses can be set correctly. Thus, the properties of manufactured surface acoustic wave filter elements are subject to less variations, and the reproducibility of the properties after repeated manufacture is improved.

Figure 13:
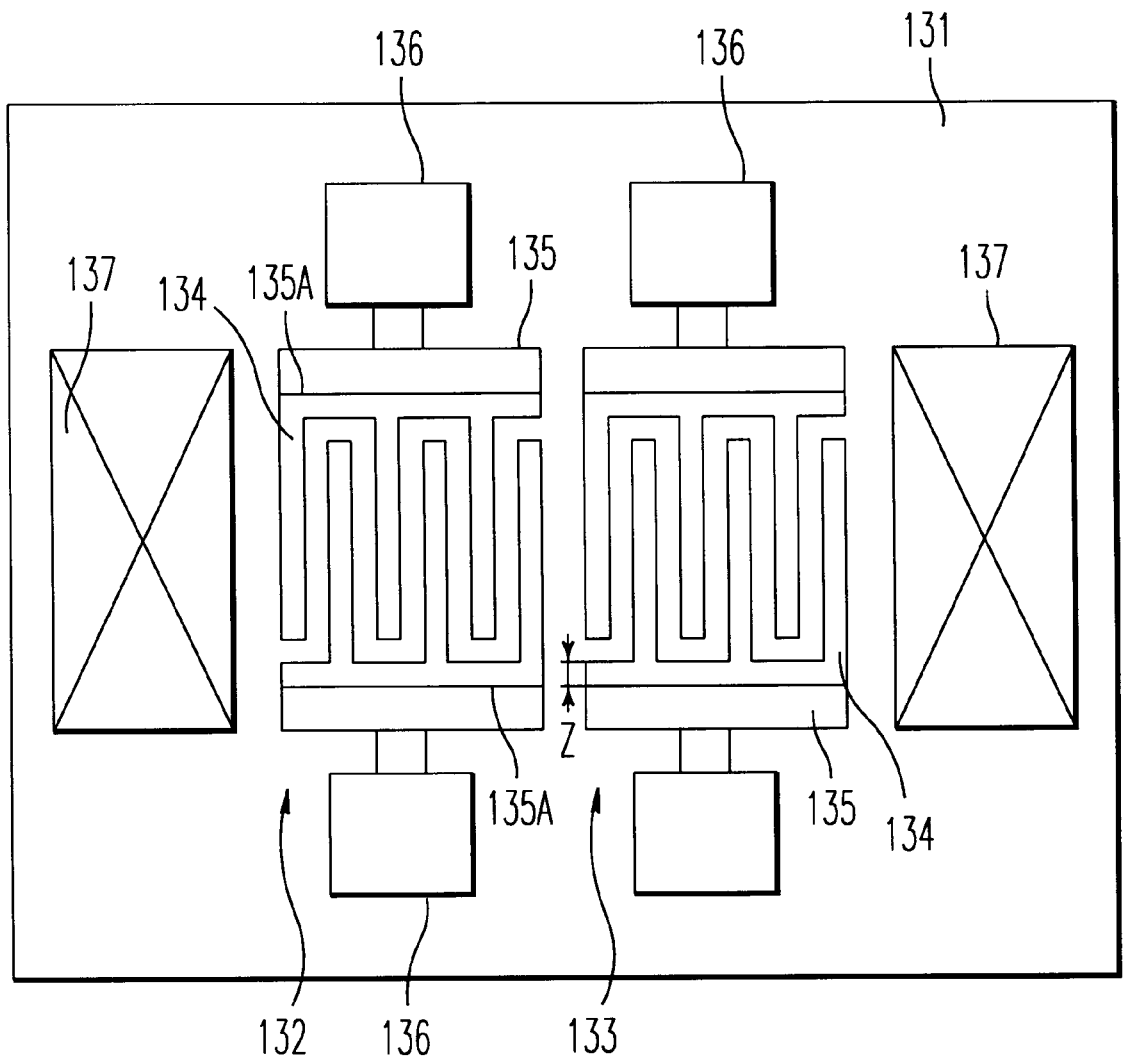
FIG. 13 is a pattern diagram of a conductive film for illustrating another embodiment of the invention.

Referring to the schematic plan view of FIG. 13, there will be described another embodiment of the present invention.

Numeral 131 denotes a piezoelectric substrate. $LiNbO_3$, $LiTaO_3$, $Li_2B_4O_7$, or quartz may be used for the piezoelectric substrate 131. In this case, 64°-Y-cut, X-propagation $LiTaO_3$ is used. A plurality of electrode fingers 134, which constitute input and output electrodes 132 and 133, are provided on the piezoelectric substrate 131. The electrode fingers 134 are connected in common by means of bus bars 135, which are connected to electrode pads 136, individually. Grating electrodes 137 are provided outside the input and output electrodes 132 and 133. Any of the electrode fingers 134, electrode pads 136, grating reflectors 137, etc. is formed as an electrode film having a predetermined pattern.

In the case where the-surface acoustic wave filter element with the aforementioned construction functions as a 800-MHz band filter, the line width and film thickness of the electrode fingers 134 are about 1.2 $\mu$m and about 160 nm, respectively. Electrode fingers 134 have a two-layer structure, including an aluminum-copper layer having a film thickness of about 155 nm and a tantalum-aluminum layer having a film thickness of about 5 nm. Any of the bus bars 35 and the electrode pads 136 has a film thickness of about 1 $\mu$m. The bus bars 135 and the electrode pads 136 have a three-layer structure, including an aluminum-copper layer having a film thickness of about 155 nm, a tantalum-aluminum layer having a film thickness of about 5 nm, and a pure aluminum layer having a film thickness of about 840 nm.

Part of each bus bar 135 has a two-layer structure, including an aluminum-copper layer and a tantalum-aluminum layer, and is provided with a step 135. Symbol Z designates the distance between the step 135a and the electrode fingers 134. The bus bars 135 may be formed having a two-layer structure as a whole and the same film thickness as the electrode fingers 134.

The surface acoustic wave filter element having the above-described construction is housed in a ceramic package. In this case, bumps of gold are formed on portions for the electrode pads 136, and the electrode pads 136 are connected to an external circuit of the package through the bumps. Thereafter, the package is sealed with a ceramic lid.

Referring now to FIG. 14, there will be described a method for manufacturing the aforementioned surface acoustic wave filter element. First, an aluminum-copper layer 142 containing 0.5% by weight of copper is formed as a first layer having a film thickness of about 155 nm on a piezoelectric substrate 141, as shown in FIG. 14(a). As a second layer, a tantalum-aluminum alloy layer 143 is formed having a film thickness of about 5 nm. As a third layer, moreover, an aluminum-copper layer 144 containing 0.5% by weight of copper is formed having a film thickness of about 840 nm. The first to third layers are formed by the sputtering method, for example. Preferably, the compositions of tantalum and aluminum that constitute the second layer should be adjusted so that the composition ratio of tantalum ranges from 39% to 75% (atomic percentage). If this range is covered, the orientation of the aluminum-copper layer 144 that constitutes the third layer is high.

Then, the regions in which the bus bars and electrode pads are formed are coated with a resist 145 by photolithography, as shown in FIG. 14(b).

Then, the resulting structure is impregnated with a mixed acid consisting mainly of, for example, phosphoric acid, and that portion of the structure which is not covered by the resist 145 is etched, whereupon the aluminum-copper layer 144, the uppermost layer, is removed, as shown in FIG. 14(c). As this is done, the mixed acid never etches the tantalum-aluminum alloy, so that only the uppermost aluminum-copper layer 144 is etched, and the second layer and the layers thereunder are left. Then, the resist is removed. In this case, the regions for the formation of the bus bars and electrode pads are thick, while the region for the electrode fingers is thin.

Then, the whole structure is coated with the resist, exposure and development are effected, and the portions for the bus bars and electrode pads are covered, whereupon a resist pattern corresponding to the electrode fingers is formed.

Then, the structure is etched by the reactive-ion etching method using, for example, $Cl_2$ gas, whereby electrode fingers 146 are formed, as shown in FIG. 14(e). Numerals 147 and 148 denote bus bars and electrode pads, respectively.

At this time, the distance Z from the electrode fingers 146 to a step 147a of each bus bar 147 is adjusted to 5 $\mu$m or more so that a resist pattern corresponding to the electrode fingers can be formed flat. If the steps 147a across the film thickness of bus bars are situated close to the electrode fingers 146, the resist for forming the electrode fingers inevitably collects in the regions of the steps 147a as it is applied after the process of FIG. 14(d), so that the resist cannot be applied flat.

By the method described above, electrodes having different film thickness are formed on one piezoelectric substrate. For example, the electrode fingers 146, which constitute input or output electrodes, have a two-layer. structure, including an aluminum-copper layer about 155 nm thick and a tantalum-aluminum alloy layer 5 nm thick, the total film thickness of the two layers being 160 nm. Further, the bus bars 147 and the electrode pads 148 have a three-layer structure, including an aluminum-copper layer about 155 nm thick, a tantalum-aluminum alloy layer 5 nm thick, and a pure aluminum layer 840 nm thick, the film thickness of the three layers being 1 $\mu$m.

Then, the surface acoustic wave filter element, having the electrodes thereon, is housed in a ceramic package 149, as shown in FIG. 14(f). As this is done, bumps 150 of gold are formed individually on the electrode pads 148, and the element is mounted and bonded so that the electrode pads 148 are connected to the external circuit pattern of the package through the bumps 150. The element is heated to about 200° C. as it is bonded. Thereafter, the package 149 is sealed with a ceramic lid 151, whereupon a surface acoustic wave filter is completed.

According to the embodiment described above, the surface acoustic wave filter can be designed so that the film thickness of the electrode fingers is set at a value for an optimum frequency characteristic and other electric properties and that the film thickness of the electrode fingers is set at a value for optimum bump strength and other mechanical properties.

The surface acoustic wave filter element has a specific acoustic velocity for each piezoelectric substrate. Therefore, the film thickness and line width of the electrode fingers can be settled substantially depending on a desired frequency. In the case of a filter that has its central frequency at 942.5 MHz, for example, the film thickness and line width are adjusted to about 160 nm and 1.2 $\mu$m, respectively.

In a conventional surface acoustic wave filter, the electrode pads and electrode fingers are formed having the same film thickness. Even though the electrode pads have the same film thickness as the electrode fingers, the mechanical strength arouses no problem in the case where the electrode pads are connected to the external circuit or envelope by the wire-bonding method. In the case of the flip-chip bonding method in which bumps are used for the connection to facilitate miniaturization or the like, a great force acts on the electrode pads that have the bumps thereon. If the film thickness of the electrode pads is equal to the film thickness of the electrode fingers, therefore, the mechanical strength of the electrode pads lowers, so that the bumps are separated in a 1.5 m gravity-drop test, for example, resulting in defectives.

The mechanical strength may possibly be enhanced by increasing the film thickness of the electrode pads by the lift-off method. Also in this case, however, the strength of bonding between the film formed by the lift-off method and an under layer is not so good that the junction between the two layers is separated when the bumps are formed on the electrode pads, thus resulting in lower yields. Although the bumps can be formed, moreover, defectives are produced in a gravity-drop test or the like, so that satisfactory bonding strength cannot be obtained.

According to the structure of the present invention, the mechanical strength of the electrode pads is high, and no defectives are produced in the case where the bumps are formed or in a drop or vibration test. If the film thickness of the bus bars is increased, the electrical resistance decreases and the insertion loss of the filter or the like is reduced. Thus, the electrical properties are improved.

Figure 15:
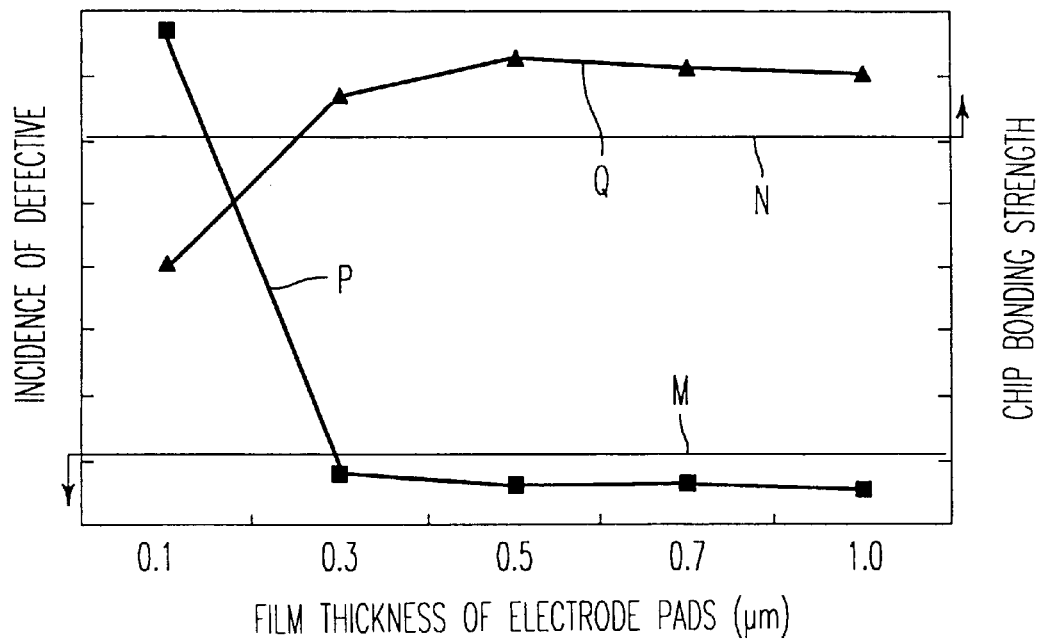
FIG. 15 shows characteristic curves for illustrating properties according to another embodiment of the invention.

Referring now to FIG. 15, there will be described the relations between the film thickness of the electrode pads and the incidence of defectives and between the film thickness of the electrode pads and the bonding strength of the chip. The axis of abscissa and the left- and right-hand axes of ordinate of FIG. 15 represent the film thickness ($\mu$m) of the electrode pads, the incidence of defectives, and the bonding strength of the chip, respectively. Further, symbols P and Q represent the defective incidence characteristic and the bonding strength characteristic, respectively. The upper limit of the allowable range of the defective incidence and the lower limit of the required range of the bonding strength are represented by lines M and N, respectively. These characteristics indicate that the incidence of defectives is low and the bonding strength is good enough if the film thickness of the electrode pads is 0.3 $\mu$m or more.

In the embodiment described above, moreover, a tantalum-aluminum alloy is used for an intermediate layer. Alternatively, however, niobium, titanium, tungsten, molybdenum, nickel, hafnium, scandium, etc. may be used for the purpose.

Tantalum and titanium have a getter function in a vacuum. In the case where tantalum or titanium is used, therefore, tantalum or titanium adhering to the inner wall surface of a vacuum unit adsorbs water and the like as the intermediate layer 103 is formed by sputtering in the vacuum unit. Accordingly, the degree of vacuum is improved when another aluminum or aluminum-copper layer is formed after tantalum-aluminum is sputtered, so that a low-resistivity aluminum layer can be formed. Thus, the whole laminate film involves no problem even if the resistance of tantalum-aluminum is relatively high.

Any other thin-film forming method than the sputtering method, such as the vacuum evaporation method or CVD method, may be utilized as the film forming method.

Figure 16:
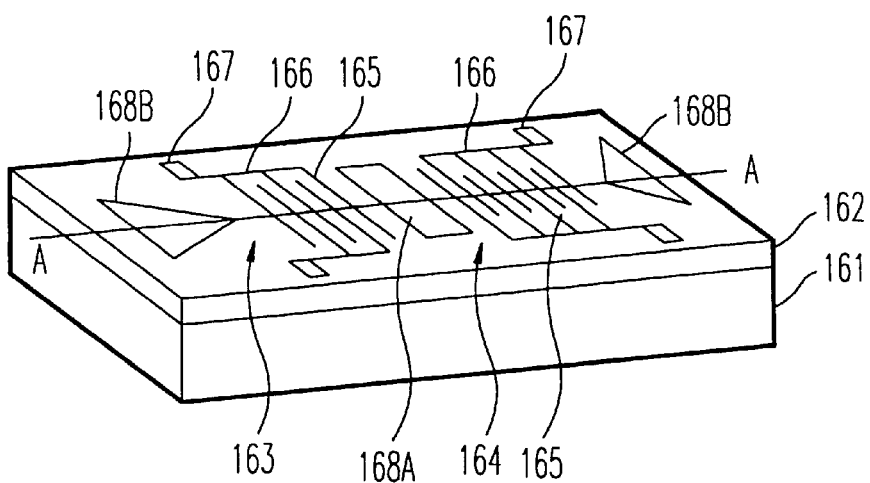
FIG. 16 is a perspective view for illustrating another embodiment of the invention.

Referring now to FIG. 16, there will be described another embodiment of the present invention. FIG. 16 shows an example of a 480-MHz surface acoustic wave filter element used in an intermediate-frequency filter of a broadcasting satellite receiver or the like.

Numeral 161 denotes a piezoelectric substrate, which is formed of LiNbO$_3$ (lithium niobate), for example. A tantalum-aluminum layer 162 is formed all over the piezoelectric substrate 161. Input and output electrodes 163 and 164 are formed on the tantalum-aluminum layer 162. The input and output electrodes 163 and 164 are formed of a plurality of combed-type electrode fingers 165 or the like each. The electrode fingers 165 are connected in common by means of bus bars 166, which are connected to electrode pads 167, individually. A shielded electrode 168a is formed between the input and output electrodes 163 and 164.

Further, surface acoustic wave absorbers 168b are provided outside the input and output electrodes 168 and 164. Electrode films for the electrode fingers 165, bus bars 166, electrode pads 167, shielded electrode 168a, etc. are formed of a material consisting mainly of aluminum.

Figure 17:
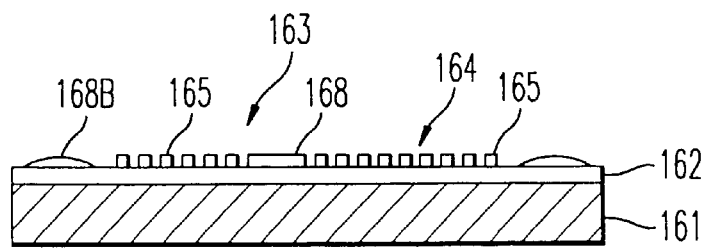
FIG. 17 is a sectional view for illustrating another embodiment of the invention.

FIG. 17 is a sectional view of the above-described surface acoustic wave filter element taken along line A—A. Like numerals in FIG. 17 are used to designate those portions which have their corresponding portions in FIG. 16, and a repeated description of those portions is omitted.

The following is a description of a method for manufacturing the aforementioned surface acoustic wave filter element.

First, a piezoelectric substrate wafer having a washed surface is set in a sputtering device, and a tantalum-aluminum film as a first layer is formed by sputtering. In order to control the film composition ratio of the tantalum-aluminum film, in this case, one target obtained by previously sinter-forming small pieces of tantalum and aluminum is used as a target member. A desired film composition ratio is controlled in accordance with the ratio between the respective surface areas of the small pieces on the target. The area ratio and the film composition ratio are not always equal. However, the composition ratio is not subject to a change with time that is caused in the case of the powder sinter molding method. Thus, the control of the composition ratio is easy, and a designed composition ratio can be obtained.

Then, after the tantalum-aluminum layer is formed, a conductive film of aluminum is formed in a vacuum without exposing the surface of the layer. If the surface is then exposed to the atmosphere, an oxide film is formed on the surface of the tantalum-aluminum film, and the orientation of the conductive film of aluminum formed on the upper layer worsens. Therefore, the conductive film of aluminum is formed without being exposed to the atmosphere.

Then, a predetermined resist pattern is formed on the conductive film by photolithography and etched to form electrodes. The wet etching method is used for this etching process. In the case where the wet etching method is used, the first layer situated under the conductive film of aluminum can be prevented from being etched as the aluminum film is etched.

Then, after the etching is finished, the resist is separated.

Then, the surface acoustic wave filter element formed on the wafer is cut down to a given size. Each resulting chip is located in a package. Thereafter, electrical connection is made by wire-bonding and the resulting structure is sealed in a nitrogen atmosphere, whereupon the surface acoustic wave filter is completed.

If the composition ratio of tantalum ranges from 39% to 75% (atomic percentage), the conductive film of aluminum exhibits high orientation. If the composition ratio of the tantalum-aluminum layer is selected within the aforesaid range, therefore, a surface acoustic wave filter element having electric power resistance can be obtained.

According to the arrangement described above, the tantalum-aluminum layer on the piezoelectric substrate functions as a resistor layer. Accordingly, the paired electrode fingers that constitute the input and output electrodes are connected by means of the tantalum-aluminum resistor layer, so that the electrode fingers and the like can be prevented from being destroyed by static electricity.

According to the embodiment described above, moreover, LiNbO$_3$ is used for the piezoelectric substrate. Alternatively, however, LiTaO$_3$, Li$_2$B$_4$O$_7$, quartz, etc. may be used for the piezoelectric substrate.

Figure 18:
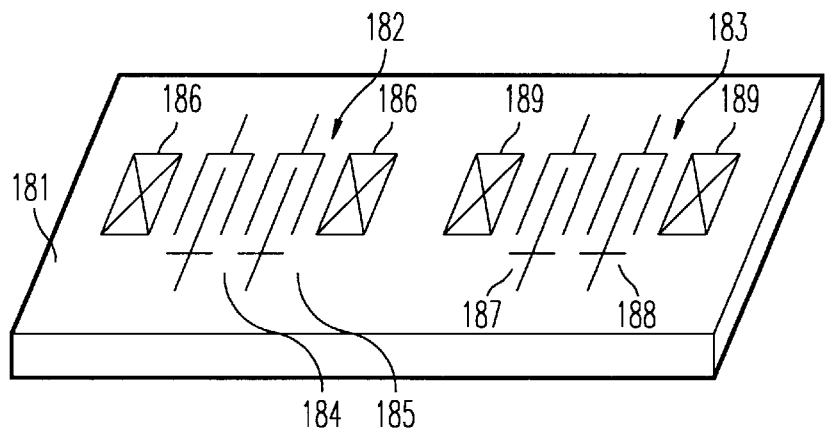
FIG. 18 is a perspective view for illustrating another embodiment of the invention.
Figure 19:
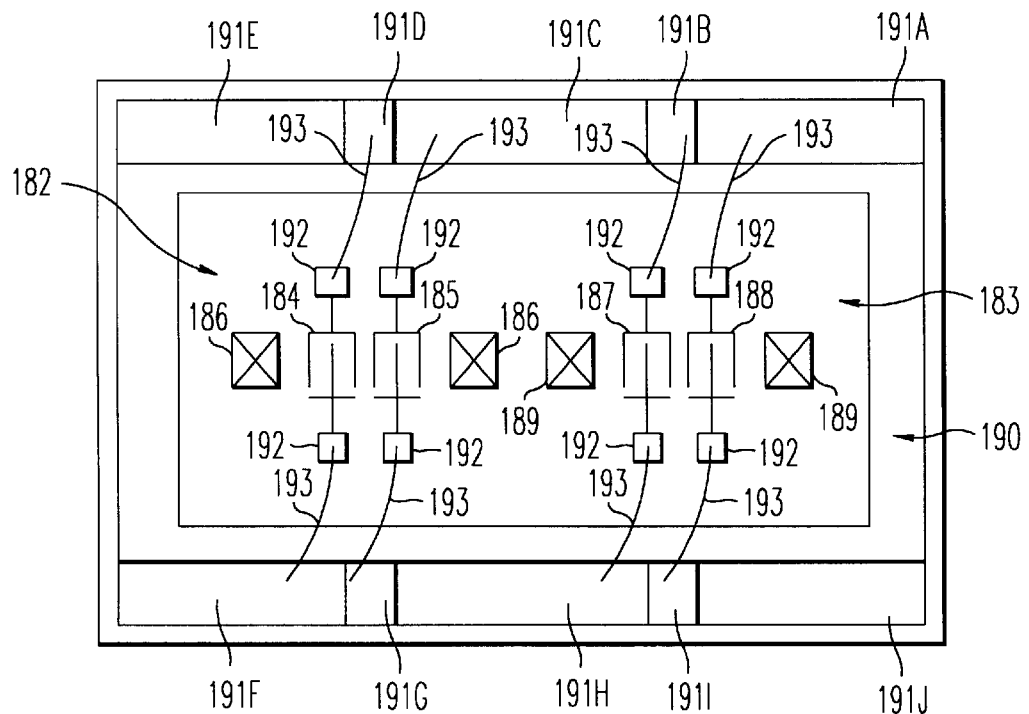
FIG. 19 is a plan view corresponding to FIG. 18.
Figure 20:
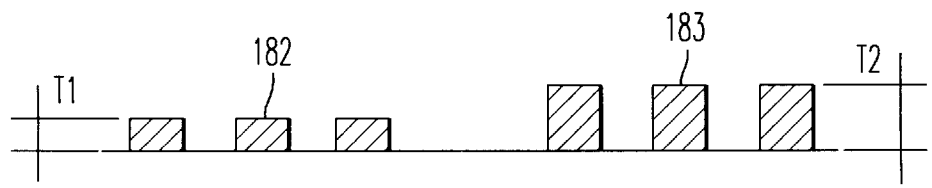
FIG. 20 is a sectional view corresponding to FIG. 18.

Referring now to FIGS. 18 to 20, there will be described another embodiment of the present invention. FIG. 18 is a perspective view, FIG. 19 is a plan view, and FIG. 20 is a partial sectional view.

Numeral 181 denotes a piezoelectric substrate. LiNbO$_3$, LiTaO$_3$, Li$_2$B$_4$O$_7$, or quartz may be used as the material of the piezoelectric substrate 181. First and second filter elements 182 and 183, surface acoustic wave filter elements, are formed on the piezoelectric substrate 181.

The first filter element 182 is composed of input and output electrodes 184 and 185, grating reflectors 185, etc. The input and output electrodes 184 and 185 are formed of combed-type electrode fingers or the like. The first filter element 182 functions as a 1.9-GHz band-pass filter, for example. The electrode fingers that constitute the input and output electrodes 184 and 185 are formed of simple aluminum or an alloy containing, for example, aluminum and about 0.5% respectively by weight of silicon and copper. In order to obtain a desired reflectivity, moreover, a film thickness t1 is adjusted to about 150 nm.

The second filter element 183 is composed of input and output electrodes 187 and 188, grating reflectors 189, etc. The input and output electrodes 187 and 188 are formed of combed-type electrode fingers or the like. The second filter element 183 functions as an 800-MHz band-pass filter, for example. The electrode fingers are formed of simple aluminum or an alloy containing, for example, aluminum and about 0.5% by weight of silicon and copper. In order to obtain a desired reflectivity, moreover, the film thickness t1 is adjusted to about 300 nm.

In the case of the arrangement described above, the film thickness t1 of the first filter element 182 is different from the film thickness t2 of the second filter element 182, as shown in FIG. 20. Accordingly, the two filter elements 182 and 183 having the different film thicknesses can be made to function as band-pass filters having different frequency bands.

In FIG. 20, band-pass filters are formed for two frequency bands. Alternatively, however, surface acoustic wave filter elements having three or more film thicknesses may be formed on one piezoelectric substrate so that band-pass filters can be formed three or more different frequency bands.

The surface acoustic wave filter element having the above-described construction is mounted in an envelope 190, and connecting pads 191a to 191j attached to the envelope 190 and electrode pads 192 of the surface acoustic wave filter element are connected by means of metallic wires 191 or the like. The filter element is sealed in the envelope 190 by means of a lid (not shown).

Figure 21:
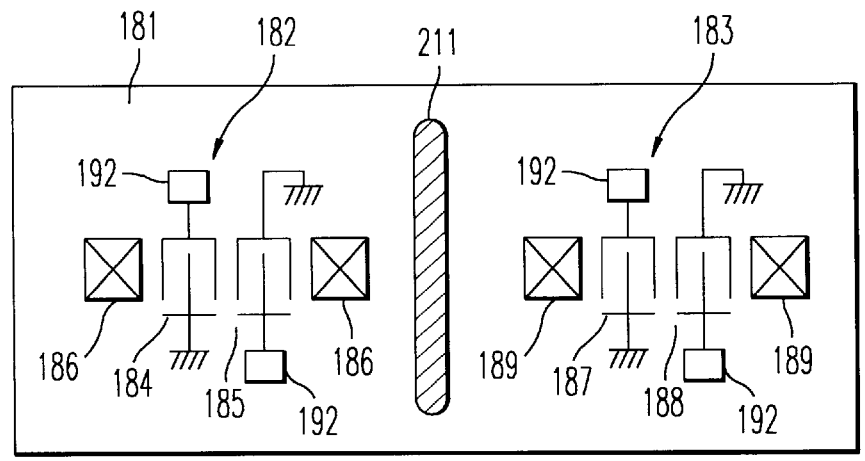
FIG. 21 is a plan view for illustrating another embodiment of the invention.
Figure 22:
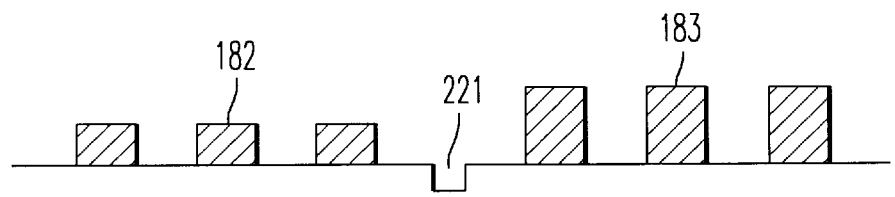
FIG. 22 is a sectional view for illustrating another embodiment of the invention.
Figure 23:
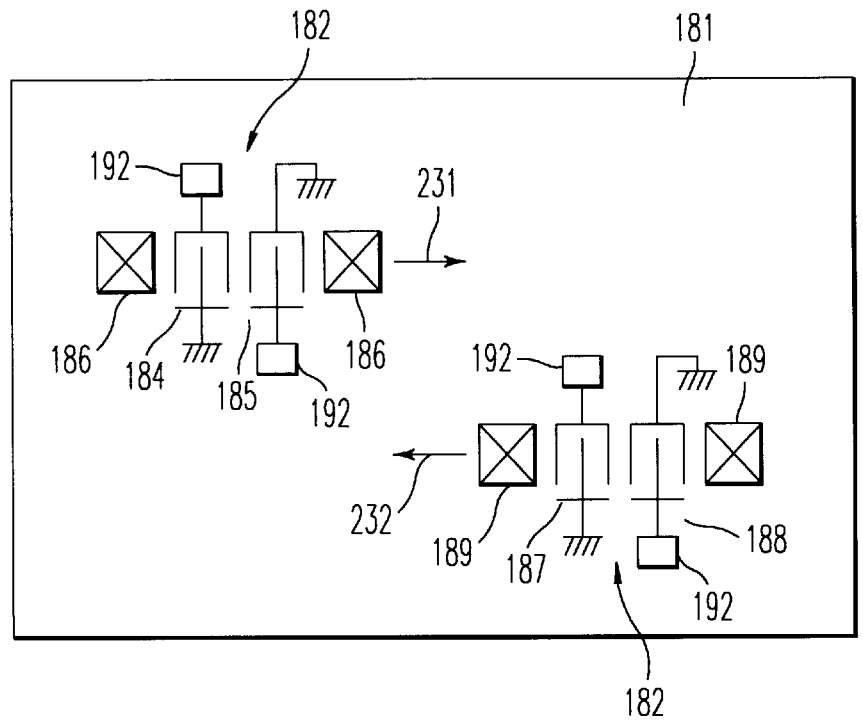
FIG. 23 is a plan view for illustrating another embodiment of the invention.

Referring now to FIGS. 21 to 23, there will be described another embodiment of the present invention. Like numerals in FIGS. 21 to 23 are used to designate those portions which have their corresponding portions in FIGS. 18 and 19, and a repeated description of those portions is omitted.

In the embodiment of FIG. 21, a surface acoustic wave absorber 211 is provided between the first and second filter elements 182 and 183. In this case, surface waves driven from the first and second filter elements 182 and 183 are cut off by the surface acoustic wave absorber 211. Thus, there is no leakage of the surface waves from the first filter element 182 to the second filter element 183 or from the second filter element 183 to the first filter element 182, so that interference between the filter elements can be eliminated.

The interference between the filter elements may be eliminated by providing a groove 221 on that portion of the piezoelectric substrate 181 which is situated between the first and second filter elements 182 and 183, as shown in FIG. 22.

As shown in FIG. 23, moreover, the first and second filter elements 182 and 183 may be located in an offset manner on the piezoelectric substrate 181 such that the a propagation direction 231 of the surface waves of the first filter element 182 is deviated from a propagation direction 232 of the surface waves of the second filter element 183.

Figure 24:
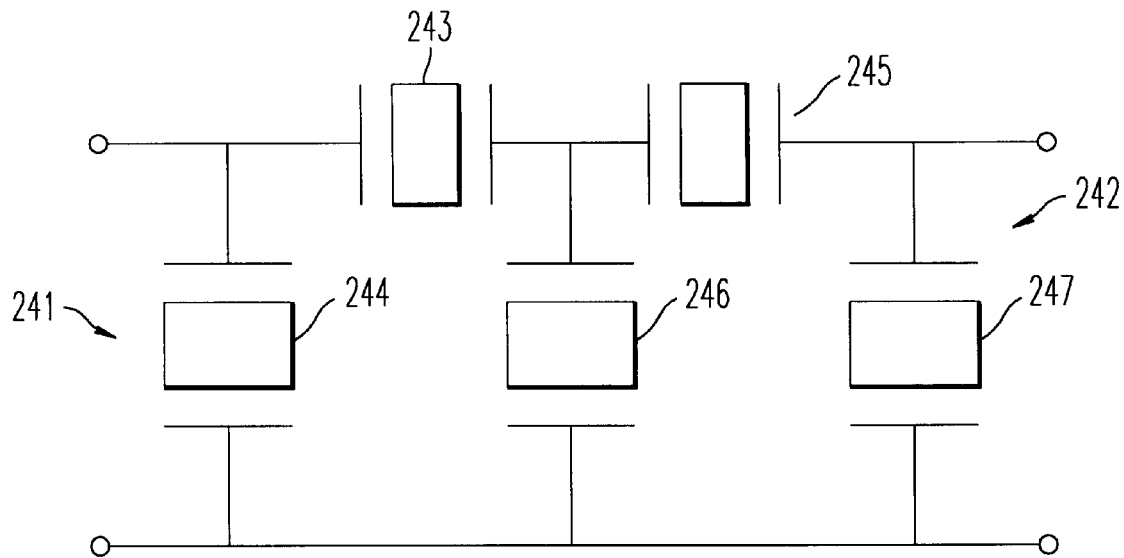
FIG. 24 is a circuit diagram for illustrating another embodiment of the invention.

Referring now to FIG. 24, there will be described another embodiment of the present invention.

In a surface acoustic wave filter of FIG. 24, five resonators 243 to 247, formed of a surface acoustic wave filter element each, are connected in the form of a ladder between input and output ends 241 and 242. In this case, the respective resonance frequencies of the resonators 243 and 244, for example, are different by 20 MHz or thereabout. As shown in FIG. 20, moreover, the respective film thicknesses of the resonators are adjusted to optimum values for their corresponding resonance frequencies.

Referring now to the vertical sectional view of FIG. 25, there will be described another embodiment of the present invention.

Figure 25:
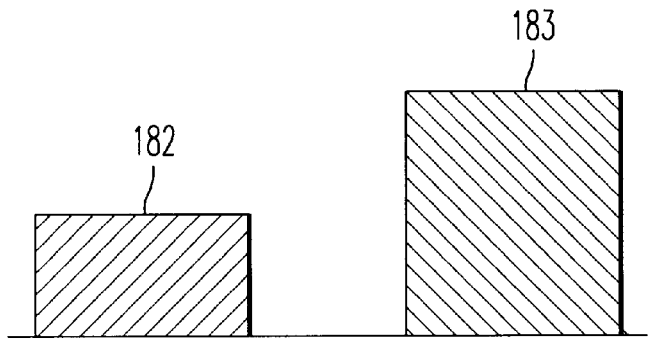
FIG. 25 is a sectional view for illustrating another embodiment of the invention.

A surface acoustic wave filter shown in FIG. 25 has the same construction as the surface acoustic wave filters shown in FIGS. 18 to 20. In this case, however, the material of a first filter element 182 is an alloy that contains aluminum and about 0.5% respectively by weight of silicon and copper. On the other hand, the material of a second filter element 183 is simple aluminum or an alloy that contains aluminum and about 0.1% respectively by weight of silicon and copper.

The alloy that contains aluminum and about 0.5% respectively by weight of silicon and copper has electric power resistance, while simple aluminum or the alloy that contains aluminum and about 0.1% respectively by weight of silicon and copper displays a good frequency characteristic. Since the first filter element 182 is expected to have electric power resistance at 1.9 GHz, it is formed of a material that fulfills this requirement. Since the second filter element 183 is expected to have a good frequency characteristic at 800 MHz, moreover, it is formed of a material that fulfills this requirement.

Figure 26:
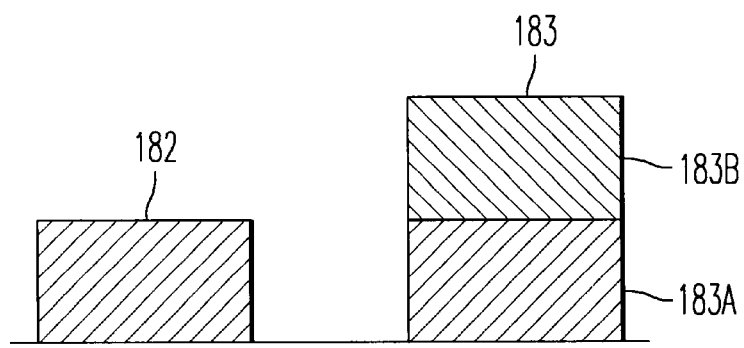
FIG. 26 is a sectional view for illustrating another embodiment of the invention.

As shown in FIG. 26, the second filter element 183, which has a greater film thickness, may be formed having a two-layer structure. For example, a lower layer 183a is formed of the same material as the first filter element 182, i.e., the alloy that contains aluminum and about 0.5% respectively by weight of silicon and copper, while an upper layer 183 is formed of simple aluminum or the alloy that contains aluminum and about 0.1% respectively by weight of silicon and copper. This arrangement produces the same effect of the embodiment of FIG. 25.

Figure 27A:
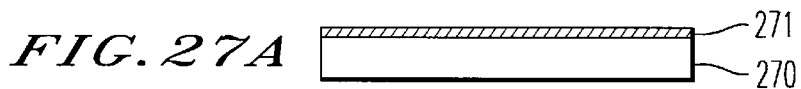
FIG. 27 illustrates manufacturing process diagram for illustrating another embodiment of the invention.

Referring now to the process diagram of FIG. 27 for lift-off I, there will be described a method for manufacturing the aforementioned surface acoustic wave filter element. First, an aluminum film 271 is formed having a thickness of about 150 nm over the whole surface of a piezoelectric substrate 270 by vacuum evaporation, as shown in FIG. 27(a).

Figure 27B:
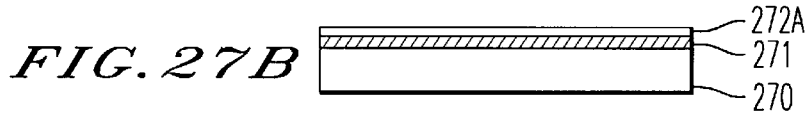

Then, a resist film 272a is applied to the whole surface of the aluminum film 271, as shown in FIG. 27(b).

Figure 27C:
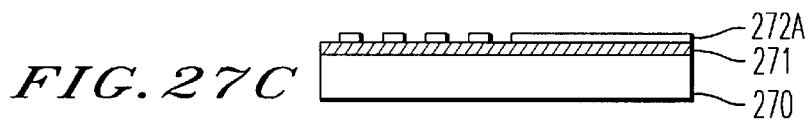

Then, the resist film 272a is exposed and developed to be partially removed, as shown in FIG. 27(c).

Figure 27D:
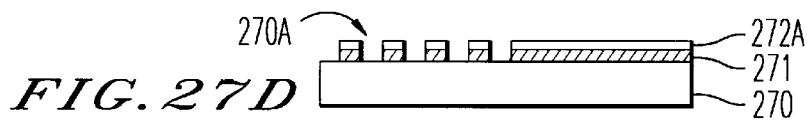

Then, the aluminum film 271 is removed by etching, as shown in FIG. 27(d).

Figure 27E:
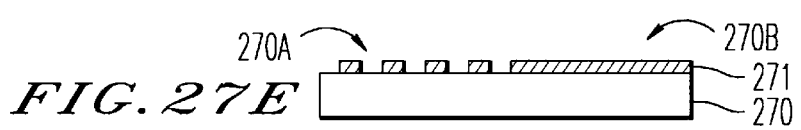

Then, the resist film 272a is removed to form a first filter element 270a, as shown in FIG. 27(e). In this case, the lift-off method may be used in place of etching.

Figure 27F:
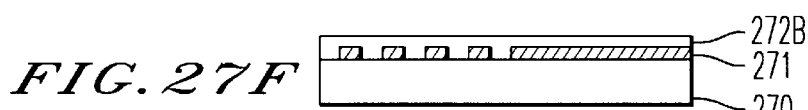

Then, a resist film 272b is applied to the whole surface including the first filter element 270a, as shown in FIG. 27(f).

Figure 27G:
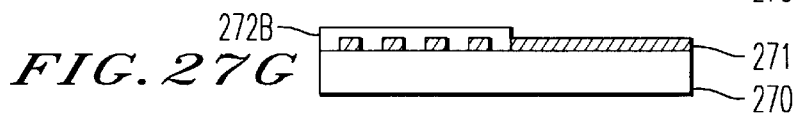

Then, the resist film 272b is exposed and developed to be partially removed, as shown in FIG. 27(g).

Figure 27H:
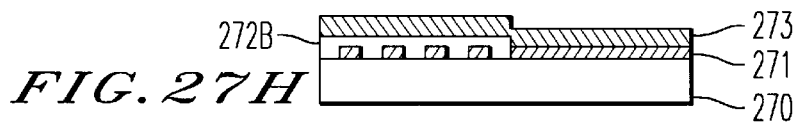

Then, a second conductive film 273 is formed on the whole surface, as shown in FIG. 27(h).

Figure 27I:
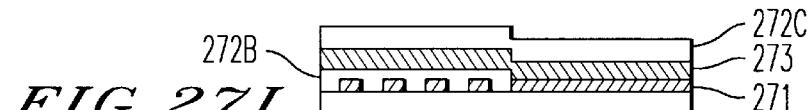
Figure 27L:
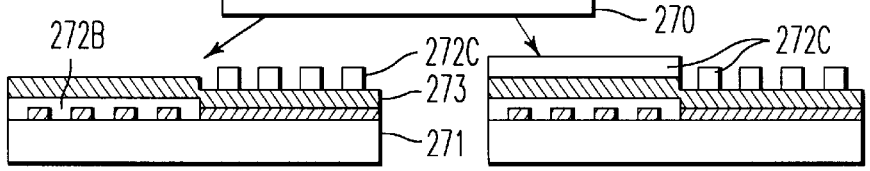
Figure 27L:
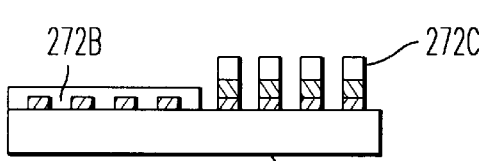
Figure 27L:
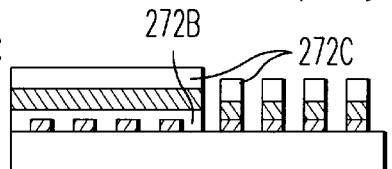

Then, a resist film 272c is applied to the whole surface, as shown in FIG. 27(i).

Thereafter, a desired surface acoustic wave filter element is formed by two methods.

A first method is a method in which the resist film 272c is exposed and developed to remove part of a region for the formation of the second filter element 270b, except a region for the first filter element 270a, as shown in FIG. 27(j1). Thereafter, the resist films 272b and 272c are removed by etching, as shown in FIG. 27(k1). As shown in FIG. 27(l), moreover, the second conductive portion 273 on the first filter element 270a is removed by the lift-off method to obtain the desired surface acoustic wave filter having the first and second filter elements 270a and 270b.

A second method is a method in which the resist film 272c is exposed and developed to remove part of the region over the first filter element 270a and the region for the second filter element 270b, as shown in FIG. 27(j2). Thereafter, the structure is etched in the manner shown in FIG. 27(k2). As shown in FIG. 27(l), moreover, the resist films 272b and 272c are removed to obtain the desired surface acoustic wave filter having the first and second filter elements 270a and 270b.

According to the manufacturing method of this embodiment, the second filter element 270b is composed of the two layers, the aluminum film 271 and the conductive film 273. Accordingly, this method is suited for the manufacture of the surface acoustic wave filter shown in FIG. 26, for example.

Figure 28A:
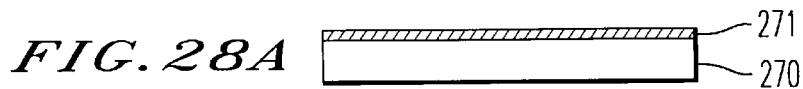
FIG. 28 illustrates manufacturing process diagram for illustrating another embodiment of the invention.

Referring now to the process diagram of FIG. 28 for lift-off II, there will be described another method for manufacturing the surface acoustic wave filter element of the present invention. First, the aluminum film 271 is formed having a thickness of about 150 nm over the whole surface of the piezoelectric substrate 270 by vacuum evaporation, as shown in FIG. 28(a).

Figure 28B:
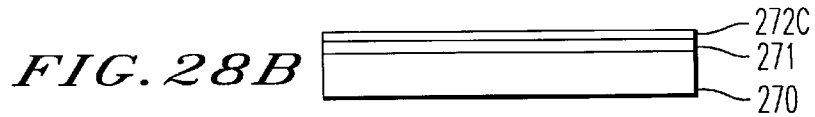

Then, the resist film 272a is applied to the whole if surface of the aluminum film 271, as shown in FIG. 28(b).

Figure 28C:
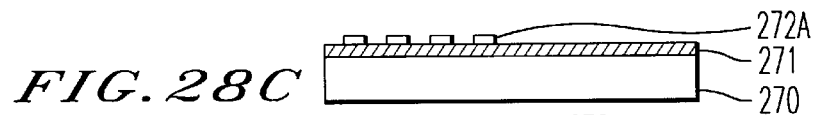

Then, part of the resist film 272a (whole of the region for the formation of the second surface acoustic wave filter element 270b) is removed by exposure and development, as shown in FIG. 28(c).

Figure 28D:
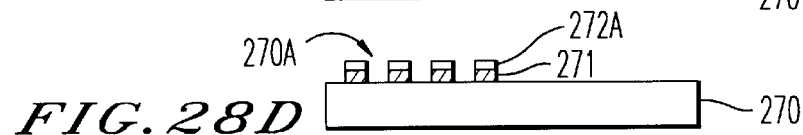

Then, the structure is etched in the manner shown in FIG. 28(d).

Figure 28E:
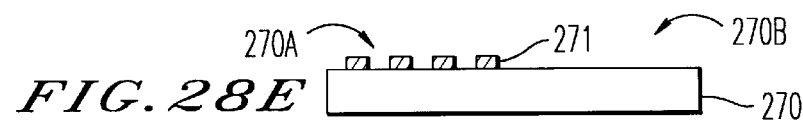

Then, the resist film 272a is removed to form the first filter element 270a, as shown in FIG. 28(e). In this case, the lift-off method may be used in place of etching.

Figure 28F:
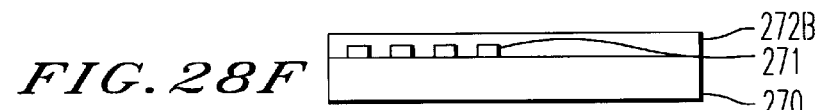

Then, the resist film 272b is applied to the whole surface including the first filter 270a, as shown in FIG. 28(f).

Figure 28G:
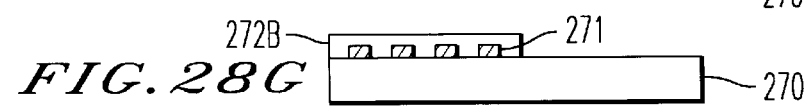

Then, the resist film 272b is exposed and developed to be partially removed, as shown in FIG. 28(g).

Figure 28H:
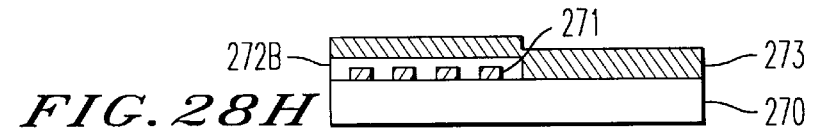

Then, the second conductive film 273 is formed on the whole surface, as shown in FIG. 28(h).

Figure 28I:
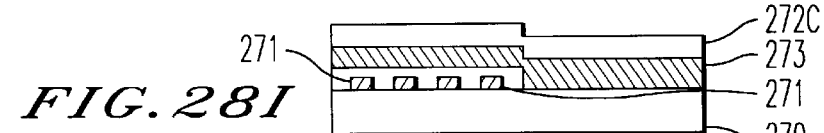
Figure 28L:
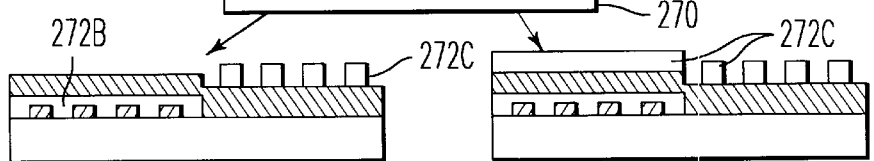
Figure 28L:
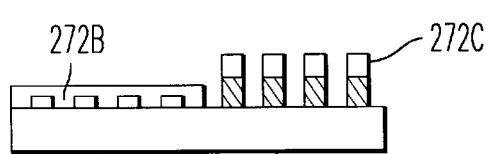
Figure 28L:
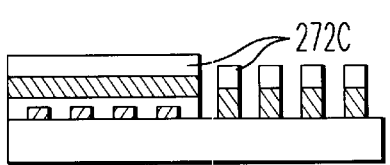
Figure 28L:
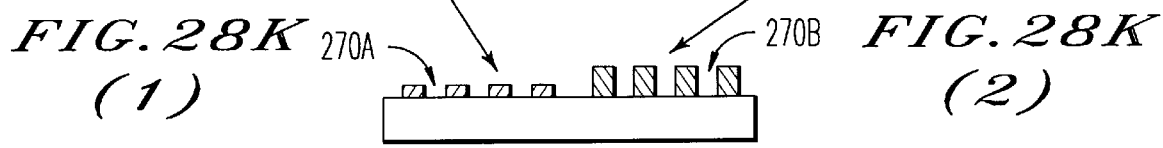
Figure 28L:
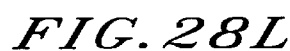

Then, the resist film 272c is applied to the whole surface, as shown in FIG. 28(i).

Thereafter, a desired surface acoustic wave filter element is formed by two methods.

A first method is a method in which that region of the resist film 272c to form the second surface acoustic wave filter element 270b, except the first surface acoustic wave filter element 270a, is first removed by exposure and development, as shown in FIG. 28(j1). Then, the structure is etched in the manner shown in FIG. 28(k1). Then, the resist films 272b and 272c are removed, and the second conductive portion 273 on the first surface acoustic wave filter element 270a is removed by the lift-off method, as shown in FIG. 28(l), to obtain the desired surface acoustic wave filter having the first and second filter elements 270a and 270b.

A second method is a method in which part of the region of the resist film 272c over the first surface acoustic wave filter element 270a and the region for the second surface acoustic wave filter element 270b is first removed by exposure and development, as shown in FIG. 28(j2). Then, the structure is etched in the manner shown in FIG. 28(k2). Then, the resist films 272b and 272c are removed in the manner shown in FIG. 28(l) to obtain the desired surface acoustic wave filter having the first and second filter elements 270a and 270b.

According to the manufacturing method of this embodiment, aluminum films for the first and second filter elements 2 and 270b are formed in separate processes. In this case, compared with the aforementioned case where the two independent processes are used for the formation, no oxide film or resist remains in the inner layer.

Referring now to the process diagram of FIG. 29, there will be described another method for manufacturing the surface acoustic wave filter element of the present invention.

Figure 29A:
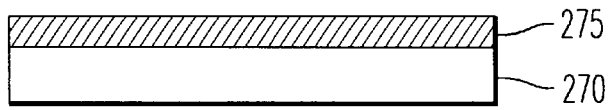
FIG. 29 illustrates manufacturing process diagram for illustrating another embodiment of the invention.

First, an aluminum film 275 is formed having a thickness of about 300 nm over the whole surface of the piezoelectric substrate 1 by vacuum evaporation, as shown in FIG. 29(a).

Figure 29B:
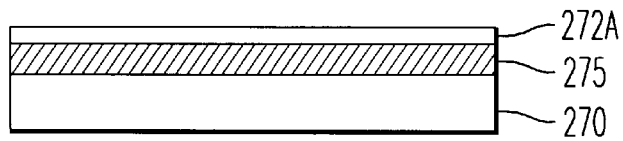

Then, the resist film 272a is applied to the whole surface of the aluminum film 275, as shown in FIG. 29(b).

Figure 29C:
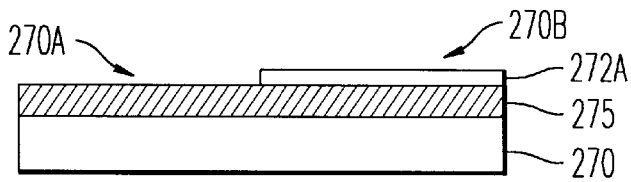

Then, the resist film 272a on the top surface of the first surface acoustic-wave filter element 270a, the thinner pattern, is removed in the manner shown in FIG. 29(c).

Figure 29D:
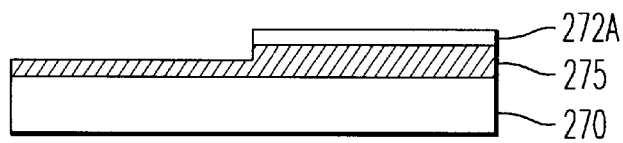

Then, the conductive portion of the first surface acoustic wave filter element 270a, the thinner pattern, is adjusted to a thickness of about 150 nm by etching, as shown in FIG. 29(d).

Figure 29E:
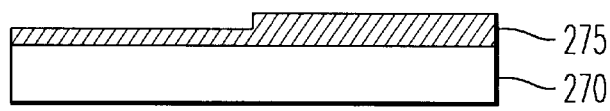

Then, the resist film 272a on the second surface acoustic wave filter element 270b, the thicker pattern, is removed in the manner shown in FIG. 29(e).

Figure 29F:
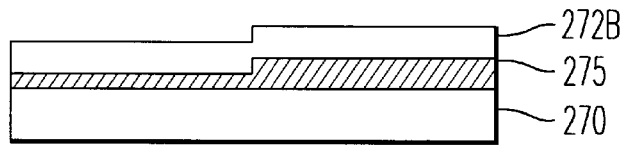

Then, the resist film 272b is applied to the whole surfaces of the first and second surface acoustic wave filter elements 270a and 270b, as shown in FIG. 29(f).

Figure 29G:
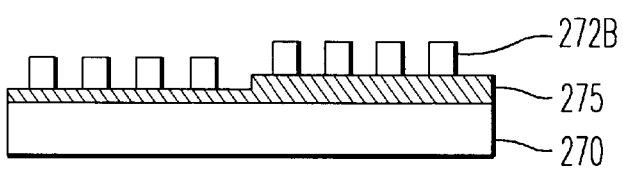

Then, those regions of the resist film 272b to form the first and second surface acoustic wave filter elements 270a and 270b are removed by exposure and development, as shown in FIG. 29(g).

Figure 29H:
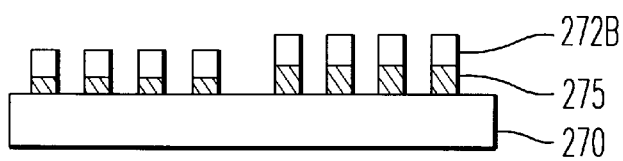

Then, the structure is etched in the manner shown in FIG. 29(h).

Figure 29I:
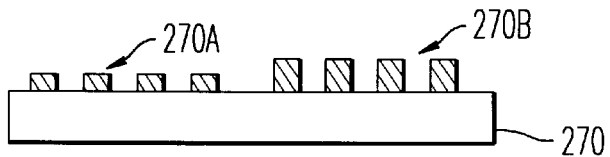

Then, the resist film 272b is removed in the manner shown in FIG. 29(i) to obtain the desired surface acoustic wave filter having the first and second filter elements 270a and 270b.

According to the manufacturing method of this embodiment, the respective conductive patterns of the first and second surface acoustic wave filter elements 270a and 270b can be formed simultaneously. Thus, the process for forming the conductive patterns is simplified. Further, a mask used to form the conductive patterns requires high accuracy. In the case of this method, however, very high accuracy is not required of the mask for the resist films. Therefore, this manufacturing method requires use of only one high-accuracy mask.

Referring now to the process diagram of FIG. 30 for lift-off III, there will be described another method for manufacturing the surface acoustic wave filter element of the present invention.

Figure 30A:
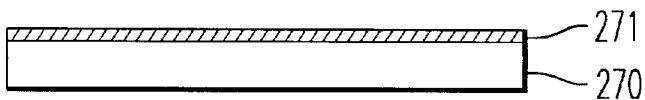
FIG. 30 illustrates manufacturing process diagram for illustrating another embodiment of the invention.

First, the aluminum film 271 is formed having a thickness of about 150 nm over the whole surface of the piezoelectric substrate 1 by vacuum evaporation, as shown in FIG. 30(a).

Figure 30B:
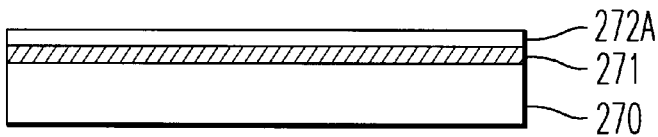

Then, the resist film 272a is applied to the whole surface of the aluminum film 271, as shown in FIG. 30(b).

Figure 30C:
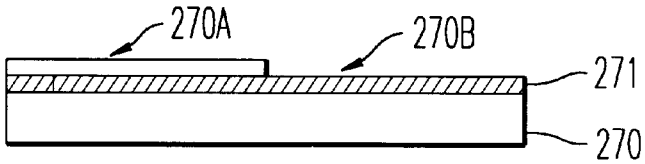

Then, the resist film 272a on the top surface of the first surface acoustic wave filter element 270b, the thicker pattern, is removed in the manner shown in FIG. 30(c).

Figure 30D:
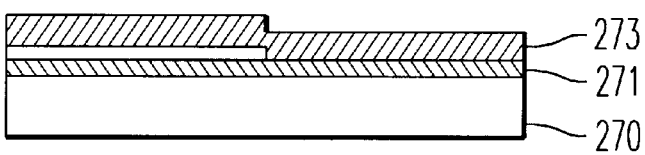

Then, the aluminum film 273 is formed having a thickness of about 150 nm over the whole surface by vacuum evaporation, as shown in FIG. 30(d).

Figure 30E:
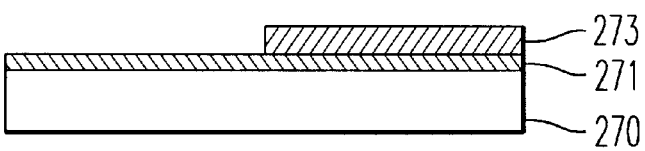

Then, the aluminum film 273 on the resist films 272a and 272a is removed by the lift-off method, as shown in FIG. 30(e).

Figure 30F:
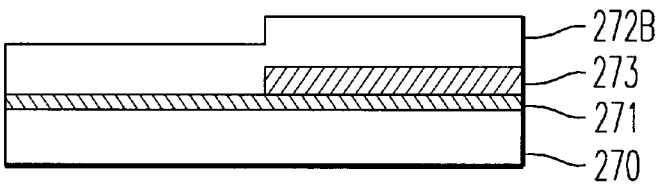

Then, the resist film 272b is applied to the whole surfaces of the first and second surface acoustic wave filter elements 270a and 270b, as shown in FIG. 30(f).

Figure 30G:
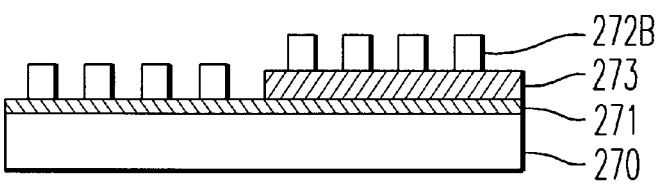

Then, those regions of the resist film 272b to form the first and second surface acoustic wave filter elements 270a and 270b are removed by exposure and development, as shown in FIG. 30(g).

Figure 30H:
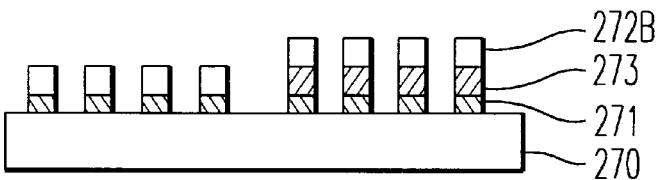

Then, the structure is etched in the manner shown in FIG. 30(h).

Figure 30I:
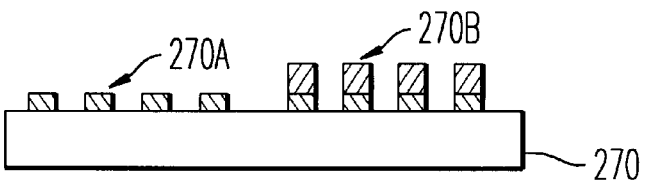

Then, the resist film 272b is removed in the manner shown in FIG. 30(i) to obtain the desired surface acoustic wave filter having the first and second filter elements 270a and 270b.

The manufacturing method according to this embodiment can produce the same effect of the manufacturing method according to the embodiment of FIG. 29.

Referring now to the process diagram of FIG. 31 for lift-off IV, there will be described another method for manufacturing the surface acoustic wave filter element of the present invention.

Figure 31A:
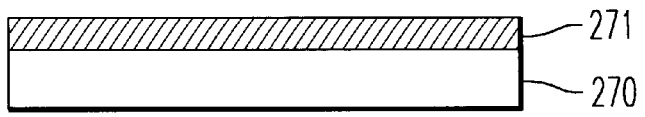
FIG. 31 illustrates manufacturing process diagram for illustrating another embodiment of the invention.

First, the aluminum film 271 is formed having a thickness of about 150 nm over the whole surface of the piezoelectric substrate 270 by vacuum evaporation, as shown in FIG. 31(a).

Figure 31B:
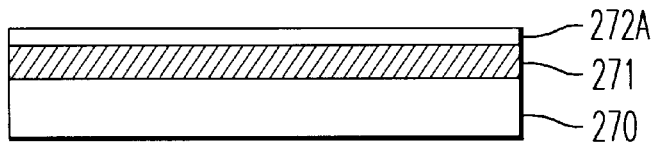

Then, the resist film 272a is applied to the whole surface of the aluminum film 271, as shown in FIG. 31(b).

Figure 31C:
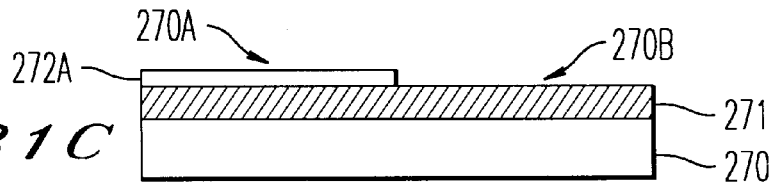

Then, the resist film 272a on the top surface of the first surface acoustic wave filter element 270b, the thicker pattern, is removed in the manner shown in FIG. 31(c).

Figure 31D:
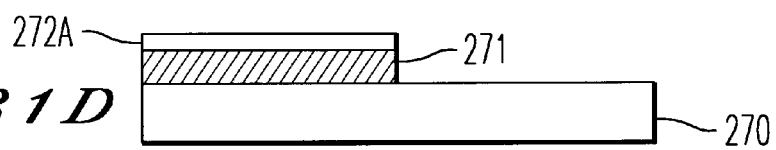

Then, the conductive portion of the second surface acoustic wave filter element 270b, the thicker pattern, is removed in the manner shown in FIG. 31(d).

Figure 31E:
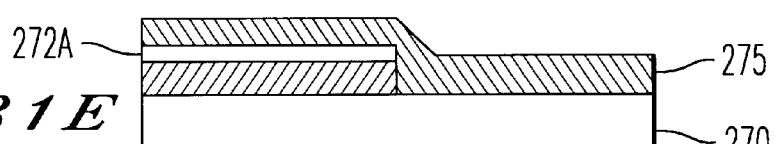

Then, the aluminum film 275 with a thickness of about 300 nm is formed over the whole surface of the piezoelectric substrate 270 by vacuum evaporation, as shown in FIG. 31(e).

Figure 31F:
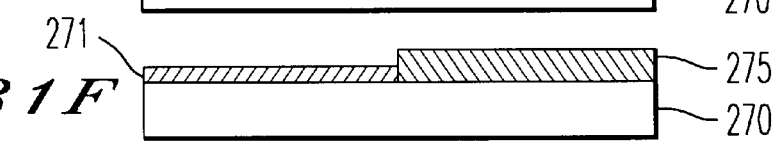

Then, the aluminum film 275 on the resist films 272 and 272a are removed by the lift-off method, as shown in FIG. 31(f).

Figure 31G:
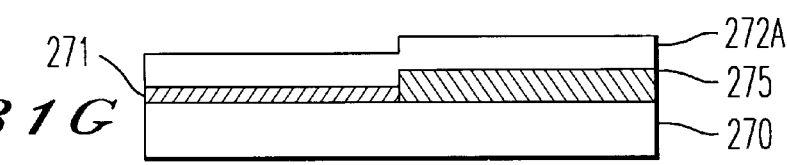

Then, the resist film 272b is applied to the whole surfaces of the first and second surface acoustic wave filter elements 270a and 270b, as shown in FIG. 31(g).

Figure 31H:
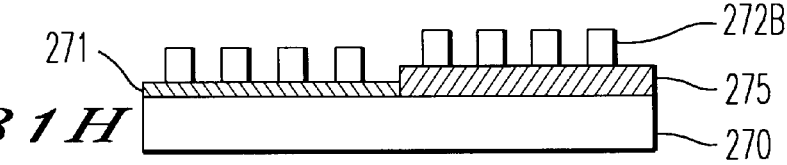

Then, those regions of the resist film 272b to form the first and second surface acoustic wave filter elements 270a and 270b are removed by exposure and development, as shown in FIG. 31(h).

Figure 31I:
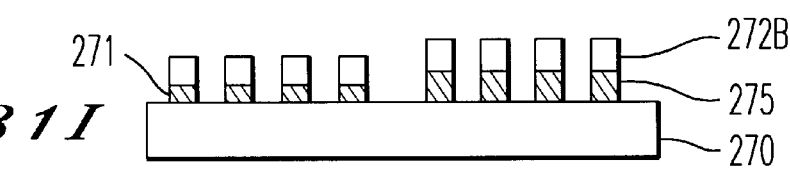

Then, the structure is etched in the manner shown in FIG. 31(i).

Figure 31J:
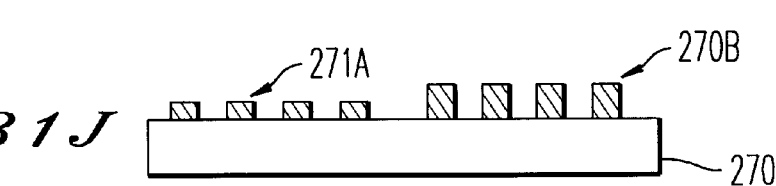

Then, the resist film 272b is removed in the manner shown in FIG. 31(j) to obtain the desired surface acoustic wave filter having the first and second filter elements 270a and 270b.

The manufacturing method according to this embodiment can produce the same effect of the manufacturing method according to the embodiment of FIG. 29.

Referring now to the process diagram of FIG. 32, there will be described another method for manufacturing the surface acoustic wave filter element of the present invention.

Figure 32A:
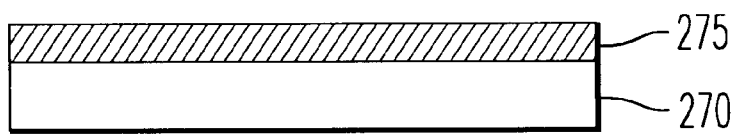
FIG. 32 illustrates manufacturing process diagram for illustrating another embodiment of the invention.

First, the aluminum film 275 is formed having a thickness of about 300 nm over the whole surface of the piezoelectric substrate 270 by vacuum evaporation, as shown in FIG. 32(a).

Figure 32B:
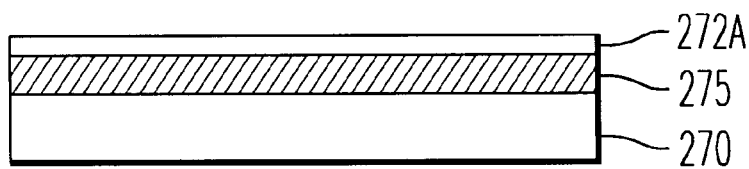

Then, the resist film 272a is applied to the whole surface of the aluminum film 275, as shown in FIG. 32(b).

Figure 32C:
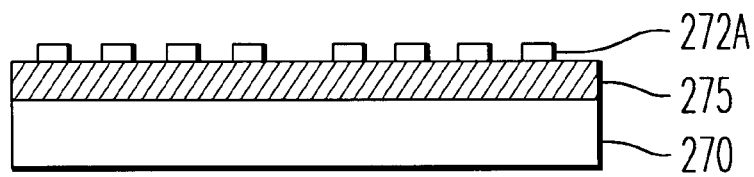

Then, those regions of the resist film 272a to form the first and second surface acoustic wave filter elements 270a and 270b are removed by exposure and development, as shown in FIG. 32(c).

Figure 32D:
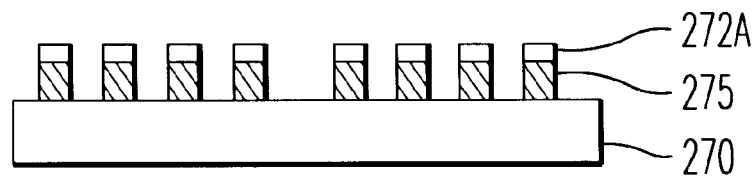

Then, the structure is etched in the manner shown in FIG. 32(d).

Figure 32E:
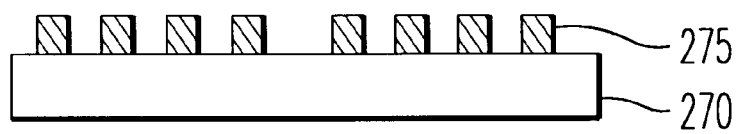

Then, the resist film 272a is removed in the manner shown in FIG. 32(e).

Figure 32F:
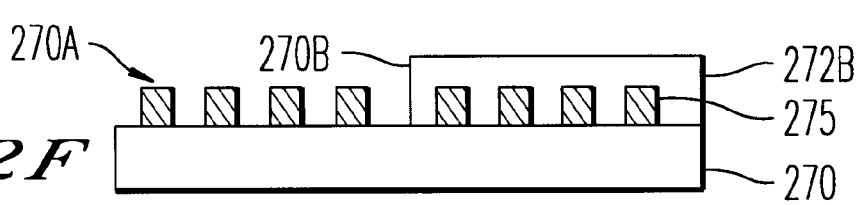

Then, the conductive pattern of the second surface acoustic wave filter element 270b, the thicker pattern, is covered with the resist film 272b, as shown in FIG. 32(f).

Figure 32G:
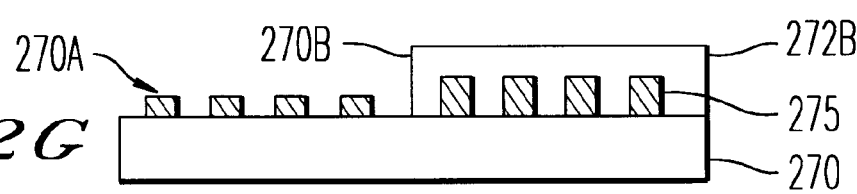

Then, the conductive pattern of the first surface acoustic wave filter element 270a, the thinner pattern, is removed by etching so that its thickness is about 150 nm, as shown in FIG. 32(g).

Figure 32H:
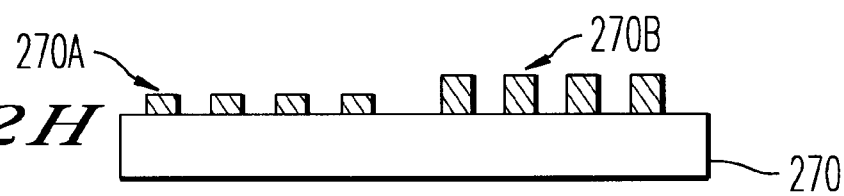

Then, the remaining resist film 272b is removed in the manner shown in FIG. 32(h).

The manufacturing method according to this embodiment can produce the same effect of the manufacturing method according to the embodiment of FIG. 29.

Figure 33:
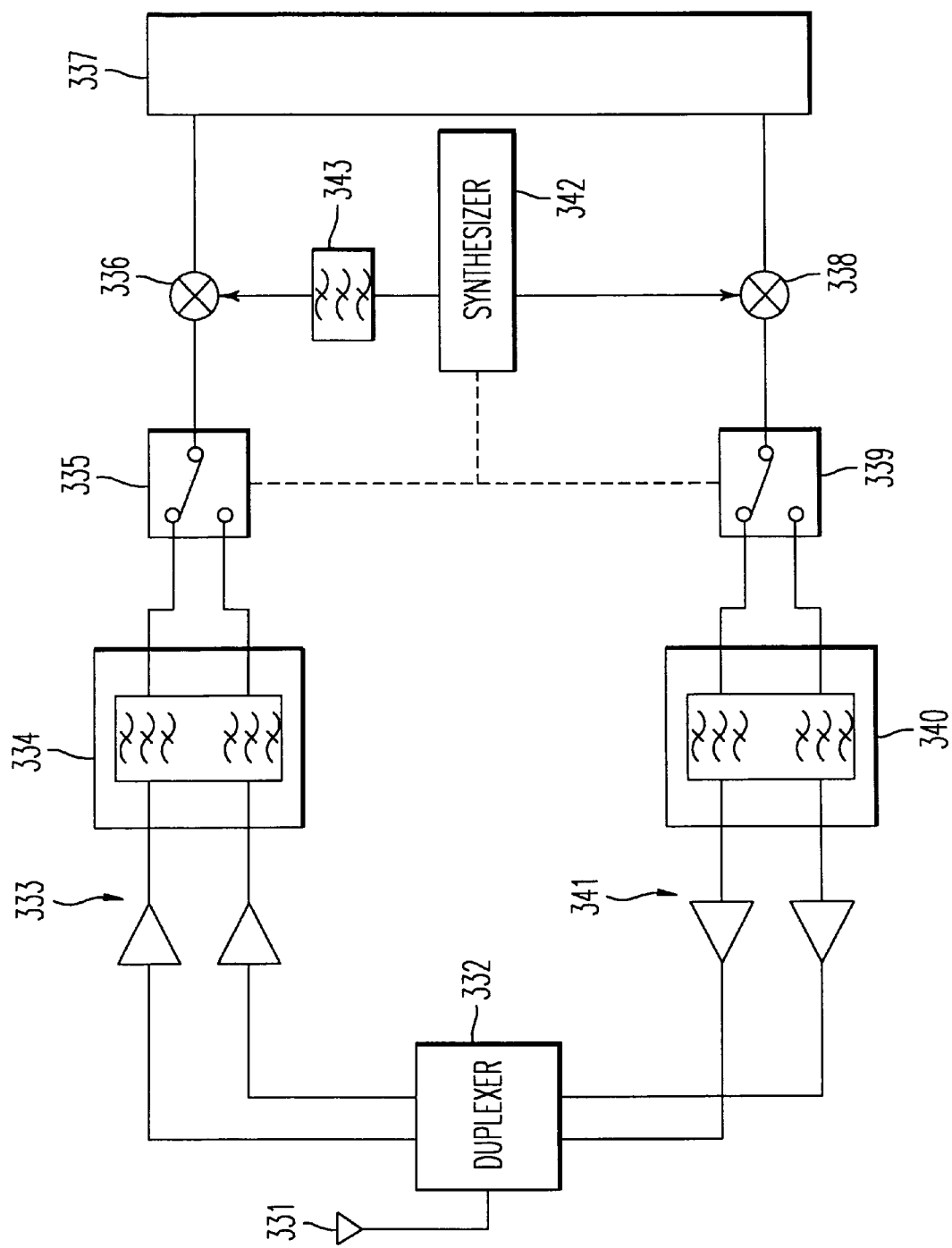
FIG. 33 is a circuit diagram for illustrating another embodiment of the invention.
Figure 34:
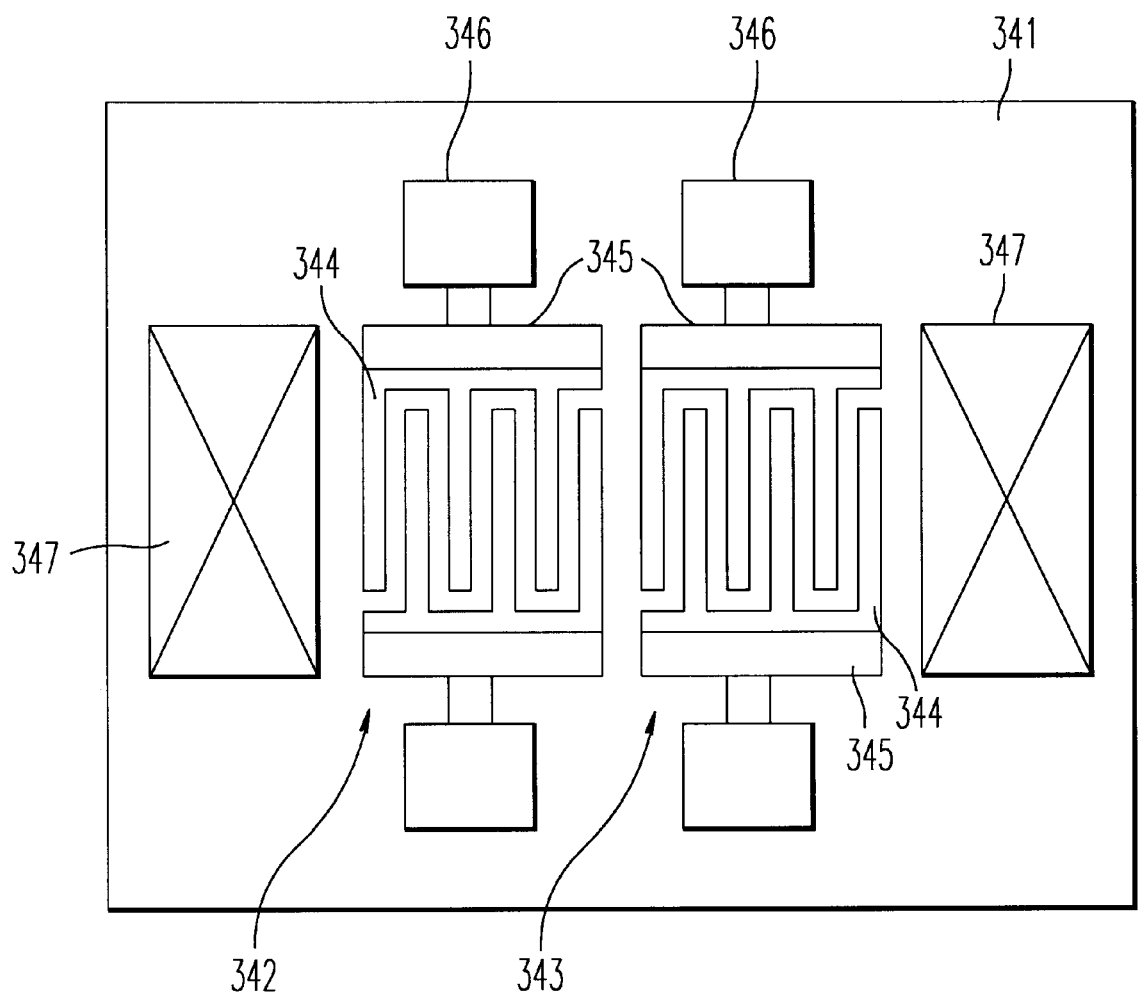
FIG. 34 is a plan view for illustrating a prior art example.

Referring now to the block diagram of FIG. 33, a case will be described in which the surface acoustic wave filter according to the present invention is applied to a dual-type portable telephone. In the case of the dual-type portable telephone, two frequencies are used for each of received and transmitted signals.

An externally transmitted signal is received by an antenna 331. The received signal received by the antenna 331 is applied to the reception-line side by means of a duplexer 332. The signal applied to the reception-line side is amplified by means of amplifiers 333 and applied to a reception filter 334.

The reception filter 334 is formed with two filter elements having different passing frequencies. Accordingly, the signal applied to the reception filter 334 is outputted through the filter element that allows the passage-of its frequency. The signal outputted from the reception filter 334 is selected by means of a switch 335. Then, the signal is converted into an intermediate frequency by means of a mixer 336 and applied to a signal processing unit 337.

On the other hand, the signal outputted from the signal processing unit 337 is converted into a signal with a transmission frequency by means of a mixer 338 and applied to a transmission unit filter 340 through a switch 339.

The transmission unit filter 340 is formed with two filter elements having different passing frequencies. The signal is outputted through the filter element on the side for the connection of the switch 339. The signal outputted from the transmission filter 340 is amplified by means of amplifiers 341 and transmitted from the antenna 331 via the duplexer 332.

A transmitting signal outputted from a synthesizer 342 is supplied as a local oscillation signal to the mixer 336 through a filter 343. The transmitting signal delivered from the synthesizer 342 is also supplied as a local oscillation signal to the mixer 338.

In the case of the embodiment described above, the reception filter 334 on the reception side and the transmission filter 340 on the transmission side are formed with two filter elements for selecting signals in two frequency bands. The surface acoustic wave filter with the configuration shown in FIGS. 18 and 19 is used as the reception or transmission filter 334 or 340.

In the case of this embodiment, a surface acoustic wave filter with one configuration can handle signals in two frequency bands, so that the cost, size, and weight of the filter can be reduced.

What is claimed is:

1. A surface acoustic wave filter comprising a piezoelectric substrate and a conductive film formed on the piezoelectric substrate, a surface acoustic wave filter characterized in that said conductive film includes a first layer containing at least tantalum and aluminum formed on the piezoelectric substrate and a metallic second layer formed on the first layer;

wherein said second layer is formed of aluminum or an alloy consisting mainly of aluminum; and wherein in the composition ratio between tantalum and aluminum in said first layer, tantalum content ranges from 39% to 75% (atomic percentage).

2. In a surface acoustic wave filter comprising a piezoelectric substrate, a plurality of electrode fingers formed on the piezoelectric substrate, a bus bar connecting the electrode fingers in common, and an electrode pad connected to the bus bar, a surface acoustic wave filter characterized in that said electrode fingers, said bus bar, and said electrode pad are each formed by alternately stacking a conductive layer consisting mainly of aluminum and an intermediate layer consisting mainly of any other metal than aluminum, and said bus bar is provided with regions in which said conductive layers are different in number.

3. A surface acoustic wave filter according to claim 2, wherein said electrode pad has the same laminate structure as the bus bar in a region involving a greater number of stacked layers, said laminate structure having thereon a conductive layer consisting mainly of aluminum and having the greatest film thickness.

4. In a surface acoustic wave filter comprising a piezoelectric substrate and surface acoustic wave filter elements having at least input and output electrodes and formed on said piezoelectric substrate, a composite surface acoustic wave filter characterized in that a plurality of surface acoustic wave filter elements are provided on the same surface of said piezoelectric substrate, a conductive film of at least one first surface acoustic wave filter element is composed of two or more layers of different compositions, a conductive film of at least one second surface acoustic wave filter element is composed of one layer or two or more layers of different compositions and is thinner than the conductive film of said first surface acoustic wave filter element, and the composition of the uppermost layer of the conductive film is different from that of said first surface acoustic wave filter element.

5. In a surface acoustic wave filter comprising a piezoelectric substrate and surface acoustic wave filter elements having at least input and output electrodes and formed on said piezoelectric substrate, a surface acoustic wave filter characterized in that a plurality of surface acoustic wave filter elements are provided on the same surface of said piezoelectric substrate, a conductive film of at least one first surface acoustic wave filter element is composed of a plurality of metallic layers including an uppermost layer formed of or consisting mainly of aluminum and a layer thereunder consisting mainly of aluminum and tantalum, a conductive film of at least one second surface acoustic wave filter element is a metallic layer including an uppermost layer formed of an alloy consisting mainly of aluminum and tantalum and having a thickness different from that of said first surface acoustic wave filter element.

6. In a surface acoustic wave filter comprising a piezoelectric substrate, a plurality of electrode fingers formed of a plurality of metallic layers on the piezoelectric substrate, a bus bar formed of a plurality of metallic layers on said piezoelectric substrate and connecting the electrode fingers in common, and an electrode pad formed of a plurality of metallic layers on said piezoelectric substrate and connected to the bus bar, a surface acoustic wave filter characterized in that said electrode-fingers and said electrode pad are different in film thickness arid surface layer metal composition, and the same metal composition of the surface layer of said electrode fingers is used for intermediate layers among the metallic layers constituting the electrode pad.

7. A surface acoustic wave filter according to claim 6, wherein the metal composition of the surface layer of said electrode fingers contains at least one of elements including tantalum, niobium, tungsten, molybdenum, nickel, hafnium, and scandium as a principal ingredient, and the metal composition of the surface layer of said electrode pad contains aluminum or an alloy consisting mainly of aluminum.

8. A surface acoustic wave filter according to claim 6, wherein the film thickness of said electrode pad is 0.3 μm or more.

9. A surface acoustic wave filter according to claim 6, wherein the distance from said electrode fingers to a portion in which the film thickness of said electrode pad or bus bar is different from the film thickness of said electrode fingers is 5 μm or more.

10. A surface acoustic wave filter according to claim 6, further comprising a package containing the piezoelectric substrate having the electrode fingers, bus bar, and electrode pad thereon and formed with an external circuit pattern, said electrode pad and said external circuit pattern being connected through one or more bump.

11. A surface acoustic wave filter according to claim 6, wherein the surface layer of said electrode fingers is formed of tantalum-aluminum alloy.

12. A surface acoustic wave filter according to claim 11, wherein the composition ratio of tantalum of the surface layer of said electrode fingers ranges 39% to 75% (atomic percentage).

* * * * *

UNITED STATES PATENT AND TRADEMARK OFFICE
CERTIFICATE OF CORRECTION

PATENT NO. : 6,377,138 B1
DATED : April 23, 2002
INVENTOR(S) : Takagi et al.

It is certified that error appears in the above-identified patent and that said Letters Patent is hereby corrected as shown below:

<u>Title page,</u>
Item [*] Notice, should read:

-- [45] Date of Patent: Apr. 23, 2002

[*] Notice     Subject to any disclaimer, the term of this patent is extented or adjusted under 35 U.S.C. 154(b) by 0 days. --

Signed and Sealed this

Sixteenth Day of July, 2002

*Attest:*

*Attesting Officer*

JAMES E. ROGAN
*Director of the United States Patent and Trademark Office*